(12) United States Patent
Sukawa et al.

(10) Patent No.: US 12,304,008 B2
(45) Date of Patent: May 20, 2025

(54) FLUX AND METHOD FOR PRODUCING ASSEMBLY

(71) Applicant: SENJU METAL INDUSTRY CO., LTD., Tokyo (JP)

(72) Inventors: Yasuhisa Sukawa, Tokyo (JP); Hiroyuki Yamasaki, Tokyo (JP); Haruya Sakuma, Tokyo (JP); Masato Shiratori, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 18/712,945

(22) PCT Filed: Dec. 1, 2022

(86) PCT No.: PCT/JP2022/044324
§ 371 (c)(1),
(2) Date: May 23, 2024

(87) PCT Pub. No.: WO2023/106188
PCT Pub. Date: Jun. 15, 2023

(65) Prior Publication Data
US 2024/0326176 A1   Oct. 3, 2024

(30) Foreign Application Priority Data

Dec. 9, 2021 (JP) ................................ 2021-199990

(51) Int. Cl.
*B23K 35/36* (2006.01)
*H05K 3/34* (2006.01)

(52) U.S. Cl.
CPC ....... *B23K 35/3612* (2013.01); *H05K 3/3489* (2013.01)

(58) Field of Classification Search
CPC ................................................ B23K 35/3612
See application file for complete search history.

(56) References Cited

U.S. PATENT DOCUMENTS

2022/0331916 A1 * 10/2022 Ukai .................... B23K 35/025

FOREIGN PATENT DOCUMENTS

| CN | 104073167 A | 10/2014 | |
|---|---|---|---|
| EP | 4108378 A1 | 12/2022 | |
| JP | 05-228690 A | 9/1993 | |
| JP | 2016-179496 A | 10/2016 | |
| JP | 2017-064759 A | 4/2017 | |
| JP | 6617848 B1 | 12/2019 | |
| JP | 2021-058899 A | 4/2021 | |
| JP | 2021-130116 A | 9/2021 | |
| WO | WO-2021065271 A1 * | 4/2021 | ........... B23K 35/025 |

OTHER PUBLICATIONS

English machine translation of JP 2016-179496A of Kashiwagi (Year: 2016).*
English Machine Translation of JP H05-228690 A of Nakamura (Year: 1993).*
International Search Report for Application No. PCT/JP2022/044324, mailed Feb. 21, 2023 (4 pages).
Chinese Office Action for Chinese App. No. 202280080554.X mailed Aug. 29, 2024 (7 pages, partial).

* cited by examiner

*Primary Examiner* — Jophy S. Koshy
(74) *Attorney, Agent, or Firm* — NIXON PEABODY LLP; Jeffrey L. Costellia

(57) ABSTRACT

A flux containing a rosin (P), a compound (SA), an activator (provided that a compound corresponding to the compound (SA) is excluded), and a solvent (provided that a compound corresponding to the compound (SA) is excluded) is adopted. The compound (SA) is a compound represented by General Formula (sa). In Formula (sa), R11 represents a hydrocarbon group which may have a hydroxy group; R12 and R13 each independently represent a hydrocarbon group having 5 or less carbon atoms, which may have a substituent, a hydroxy group, or a hydrogen atom; and m represents a positive integer.

15 Claims, No Drawings

FLUX AND METHOD FOR PRODUCING ASSEMBLY

TECHNICAL FIELD

The present invention relates to a flux and a method for producing an assembly. Priority is claimed on Japanese Patent Application No. 2021-199990, filed on Dec. 9, 2021, the content of which is incorporated herein by reference.

BACKGROUND ART

Fixing of components to a substrate and electrical connection of components to the substrate are generally performed by soldering. In the soldering, a flux, a solder, or a solder paste obtained by mixing the flux and the solder is used.

The flux has an effect of chemically removing metal oxides present on the metal surface of an object to be joined, which is a soldering target, and on the solder, thereby enabling the movement of metal elements at the boundary between the metal surface of the object to be joined and the solder. Therefore, by performing the soldering using the flux, an intermetallic compound is formed between the metal surface of the object to be joined and the solder, and strong joining can be obtained.

In the soldering, a method such as flow soldering and reflow soldering is adopted depending on the size of the object to be joined.

In the flow soldering, first, the flux is applied onto a substrate on which a component has been mounted. Next, the soldering is performed by bringing the molten solder jetted from below into contact with the soldering surface while transporting the substrate on which the component is mounted.

In the reflow soldering, first, the solder paste is printed on a substrate. Next, a component is mounted, and the substrate on which the component has been mounted is heated in a heating furnace called a reflow furnace to perform the soldering.

The flux used for soldering generally contains a resin component, a solvent, an activator, a thixotropic agent, and the like. For example, in Examples of Patent Document 1, a flux used for flow soldering, which contains a rosin as a resin component, and an organic acid, an organic halogen compound, or an amine hydrohalic acid salt as an activator, is disclosed.

CITATION LIST

Patent Document

[Patent Document 1]
Japanese Patent No. 6617848

SUMMARY OF INVENTION

Technical Problem

Meanwhile, in recent years, lead-free solders have been used in consideration of adverse effects on the environment. Since the lead-free solder has a high melting point, it is necessary to heat the lead-free solder to a higher temperature to melt the lead-free solder during soldering. As the temperature of the molten solder is higher, oxides (referred to as dross) are likely to be generated.

In particular, with regard to a solder containing Sn and Bi, since Bi is easily oxidized, there is a case in which the dross is generated in a molten state. In addition, in a case where the solder containing Sn and Bi is used, the generated dross is likely to adhere to a substrate. The dross adhering to the substrate may cause a short circuit, a decrease in insulation resistance, or the like.

In the flux disclosed in Patent Document 1, there is a case in which the dross is likely to adhere to a surface of the substrate. An object of the present invention is to provide a flux and a method for producing an assembly, which can suppress adhesion of dross to a surface of a substrate in soldering.

Solution to Problem

In order to solve the above-described problem, the present invention employs the following configurations.

That is, a first aspect of the present invention is a flux containing a rosin (P), a compound (SA) represented by General Formula (sa), an activator (provided that a compound corresponding to the compound (SA) is excluded), and a solvent (provided that a compound corresponding to the compound (SA) is excluded).

$$R^{12}\!-\!\!\left(\!R^{11}O\!\right)_{\!m}\!\!-\!R^{13} \quad \text{(s a)}$$

[in Formula (sa), $R^{11}$ represents a hydrocarbon group which may have a hydroxy group, $R^{12}$ and $R^{13}$ each independently represent a hydrocarbon group having 5 or less carbon atoms, which may have a substituent, a hydroxy group, or a hydrogen atom, and m represents a positive integer]

In the flux according to the first aspect, it is preferable that the rosin (P) includes a rosin (PA) having a softening point of higher than 100° C. and a rosin (PB) having a softening point of 100° C. or lower.

In the flux according to the first aspect, it is preferable that a mixing ratio of the rosin (PA) and the rosin (PB) in terms of a mass ratio represented by (PA)/(PB) is (PA)/(PB)=5/5 to 9/1.

In the flux according to the first aspect, it is preferable that the rosin (PA) includes at least one rosin (P1) selected from the group consisting of an acrylic acid-modified hydrogenated rosin and a polymerized rosin, and the rosin (PB) includes a hydrogenated rosin.

In the flux according to the first aspect, it is preferable that a content of the compound (SA) is 1 to 60 parts by mass with respect to 100 parts by mass of the rosin (P).

In the flux according to the first aspect, it is preferable that the activator includes a compound represented by General Formula (a1).

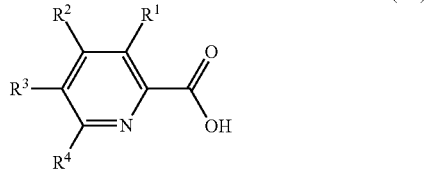

[in Formula (a1), $R^1$, $R^2$, $R^3$, and $R^4$ each independently represent a hydrocarbon group, a hydroxy group, a halogen atom, or a hydrogen atom]

In the flux according to the first aspect, it is preferable that the activator includes an alkanolamine.

In the flux according to the first aspect, it is preferable that the solvent includes at least one selected from the group consisting of ethanol and 2-propanol.

In the flux according to the first aspect, it is preferable that a concentration of solid contents is 20% by mass or less.

In addition, a second aspect of the present invention is a method for producing an assembly, including a step of soldering a solder alloy to a surface of a substrate treated with the flux according to the first aspect to obtain an assembly.

In the method for joining an assembly according to the second aspect, it is preferable that the solder alloy consists of a solder alloy containing Sn and Bi.

Advantageous Effects of Invention

According to the present invention, it is possible to provide a flux and a method for producing an assembly, which can suppress adhesion of dross to a surface of a substrate in soldering.

DESCRIPTION OF EMBODIMENTS (Flux)

The flux according to the first aspect can be used for both flow soldering and reflow soldering, but is preferably used for flow soldering.

Hereinafter, an embodiment of a case where the flux according to the first aspect is adopted to a flux for flow soldering will be described.

The flux according to the above-described embodiment contains a rosin (P), a compound (SA), an activator (provided that a compound corresponding to the compound (SA) is excluded), and a solvent (provided that a compound corresponding to the compound (SA) is excluded). The compound (SA) will be described later.

In the present specification, a solid content of the flux means all remaining components obtained by removing only a solvent from the flux.

<Rosin>

The flux according to the present embodiment contains a rosin (P).

In the present invention, the term "rosin" includes natural resins containing a mixture of abietic acid and its isomer with abietic acid as a main component, and resins (may be referred to as rosin derivatives) which are obtained by chemically modifying natural resins.

The total content of the abietic acid and isomers of abietic acid in the natural resin is, for example, 40% by mass or more and 80% by mass or less with respect to the natural resin.

In the present specification, the term "main component" refers to a component contained in a compound by an amount of 40% by mass or more, among components constituting the compound.

As typical isomers of abietic acid, neoabietic acid, palustric acid, and levopimaric acid are exemplary examples. The structure of abietic acid is shown below.

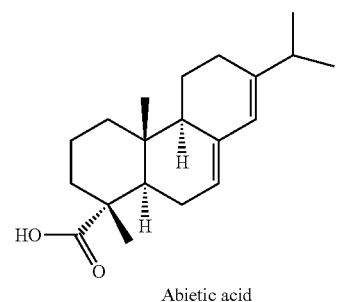

Abietic acid

As the above-described "natural resin" a gum rosin, a wood rosin, and a tall oil rosin are exemplary examples.

In the present invention, the "resins (rosin derivatives) which are obtained by chemically modifying natural resins" include those obtained by subjecting the above-described "natural resins" to one or more treatments selected from the group consisting of hydrogenation, dehydrogenation, neutralization, alkylene oxide addition, amidation, dimerization and multimerization, esterification, and Diels-Alder cycloaddition.

As the rosin derivatives, for example, a purified rosin and a modified rosin are exemplary examples.

As the modified rosin, a hydrogenated rosin, a polymerized rosin, a polymerized hydrogenated rosin, a disproportionated rosin, an acid-modified rosin, a rosin ester, an acid-modified hydrogenated rosin, an acid anhydride-modified hydrogenated rosin, an acid-modified disproportionated rosin, an acid anhydride-modified disproportionated rosin, a phenol-modified rosin, an α,β unsaturated carboxylic acid-modified product (such as an acrylated rosin, a maleated rosin, and a fumarated rosin), purified products, hydrides, and disproportionated products of the polymerized rosin, purified products, hydrides, and disproportionated products of the α,β unsaturated carboxylic acid-modified product, a rosin alcohol, a rosin amine, a hydrogenated rosin alcohol, a rosin ester, a hydrogenated rosin ester, a rosin soap, a hydrogenated rosin soap, and an acid-modified rosin soap are exemplary examples.

As the rosin amine, for example, a dehydroabietylamine and a dihydroabietylamine are exemplary examples.

The rosin amine means so-called a disproportionated rosin amine.

The structures of the dehydroabietylamine and the dihydroabietylamine are each shown below.

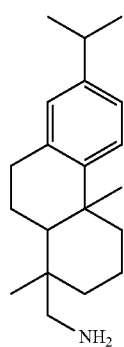

Dehydroabietylamine

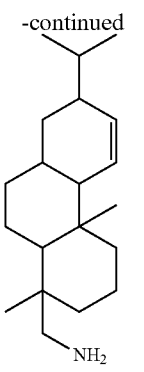
Dihydroabietylamine

For the rosin (P), one type may be used alone, or two or more types may be mixed and used.

The rosin (P) preferably includes a rosin derivative; more preferably includes one or more selected from the group consisting of an acid-modified rosin, a polymerized rosin, a hydrogenated rosin, an acid-modified hydrogenated rosin, and a rosin ester; still more preferably includes one or more selected from the group consisting of an acid-modified hydrogenated rosin, a polymerized rosin, a hydrogenated rosin, and a rosin ester; and particularly preferably includes one or more selected from the group consisting of an acid-modified hydrogenated rosin and a hydrogenated rosin.

As the acid-modified hydrogenated rosin, an acrylic acid-modified hydrogenated rosin is preferable.

It is preferable that the rosin (P) includes a rosin (PA) having a softening point of higher than 100° C. and a rosin (PB) having a softening point of 100° C. or lower.

The softening point of the rosin can be measured by a ring and ball method. Examples of the ring and ball method include the method described in JIS K 5902, and the softening point can be measured specifically by the following procedure.

First, a sample to be measured is quickly fused at as low a temperature as possible, and then a ring is carefully filled with the fused sample so that no bubbles are formed in the ring placed on a flat metal plate. After cooling, a slightly heated small knife is used to cut off a raised portion from a flat surface including the upper end of the ring. Next, a support (ring stand) is put into a glass container (heating bath) having a diameter of 85 mm or more and a height of 127 mm or more, and the heat medium is poured until the depth is to be 90 mm or more. Next, a steel ball (diameter: 9.5 mm, weight: 3.5 g) and the ring filled with the sample are immersed in the heat medium so as not to come into contact with each other, and the temperature of the heat medium is maintained at 20° C.±5° C. for 15 minutes. Next, the steel ball is placed on the center of the surface of the sample in the ring, and the steel ball is placed at a fixed position on the support. Next, a distance from the upper end of the ring to the heat medium surface is maintained at 50 mm, a thermometer is placed, a position of a center of a mercury ball of the thermometer is set to the same height as the center of the ring, and the container is heated. Flame of the Bunsen burner used for the heating is located at the center between the center and the edge of the bottom of the container to make the heating uniform. The rate of increase in the bath temperature after the heating starts and reaches 40° C. should be 5.0±0.5° C. per minute. The temperature at which the sample gradually softens, flows down from the ring, and finally comes into contact with the bottom plate is read, and this temperature is defined as the softening point. The softening point is measured in two or more samples at the same time, and the average value thereof is adopted.

In a case where the softening point of the measurement target is 80° C. or lower, water is used as the heat medium. In addition, in a case where the softening point of the measurement target is higher than 80° C., glycerin is used as the heat medium.

In a case where the rosin (P) contains the rosin (PA), sticking of the flux residue is more easily reduced.

The softening point of the above-described rosin (PA) is preferably 110° C. or higher, more preferably 115° C. or higher, still more preferably 120° C. or higher, particularly preferably 125° C. or higher, and most preferably 130° C. or higher.

In a case where the softening point of the above-described rosin (PA) is equal to or higher than the above-described lower limit value, the sticking of the flux residue is more easily reduced.

The softening point of the above-described rosin (PA) is preferably 170° C. or lower, more preferably 160° C. or lower, and still more preferably 150° C. or lower.

The softening point of the above-described rosin (PA) may be higher than 100° C. and 170° C. or lower, and is preferably 110° C. or higher and 160° C. or lower, more preferably 115° C. or higher and 160° C. or lower, still more preferably 120° C. or higher and 160° C. or lower, particularly preferably 125° C. or higher and 160° C. or lower, and most preferably 130° C. or higher and 160° C. or lower.

Alternatively, the softening point of the above-described rosin (PA) is preferably 110° C. or higher and 150° C. or lower, more preferably 115° C. or higher and 150° C. or lower, still more preferably 120° C. or higher and 150° C. or lower, particularly preferably 125° C. or higher and 150° C. or lower, and most preferably 130° C. or higher and 150° C. or lower.

In a case where the softening point of the above-described rosin (PA) is within the above-described range, the sticking of the flux residue is more easily reduced.

In a case where the rosin (P) contains the above-described rosin (PB), fluidity of the flux is more easily enhanced. As a result, it is easier to further suppress soldering defects.

The softening point of the above-described rosin (PB) is preferably 96° C. or lower and more preferably 93° C. or lower.

In a case where the softening point of the above-described rosin (PB) is equal to or lower than the above-described upper limit value, the fluidity of the flux is more easily enhanced. As a result, it is easier to further suppress soldering defects.

The softening point of the above-described rosin (PB) is preferably 60° C. or higher, more preferably 65° C. or higher, and still more preferably 70° C. or higher.

The softening point of the above-described rosin (PB) may be 60° C. or higher and 100° C. or lower, and is preferably 60° C. or higher and 96° C. or lower, more preferably 65° C. or higher and 96° C. or lower, and still more preferably 70° C. or higher and 96° C. or lower.

Alternatively, the softening point of the above-described rosin (PB) is preferably 60° C. or higher and 93° C. or lower, more preferably 65° C. or higher and 93° C. or lower, and still more preferably 70° C. or higher and 93° C. or lower.

In a case where the softening point of the above-described rosin (PB) is within the above-described range, the fluidity of the flux is more easily enhanced. As a result, it is easier to further suppress soldering defects.

For the above-described rosin (PA), one type may be used alone, or two or more types may be mixed and used.

The above-described rosin (PA) preferably includes at least one kind rosin (P1) selected from the group consisting of an acid-modified hydrogenated rosin and a polymerized rosin, and may be composed of only the rosin (P1).

For the above-described rosin (PB), one type may be used alone, or two or more types may be mixed and used.

As the above-described rosin (PB), for example, a hydrogenated rosin, a rosin ester, and the like are exemplary examples.

From the viewpoint of enhancing the fluidity of the flux, the above-described rosin (PB) preferably includes a hydrogenated rosin, and may be composed of only a hydrogenated rosin.

From the viewpoint of enhancing heat resistance of the flux, the above-described rosin (PB) preferably includes a rosin ester.

A content of the above-described rosin (P) in the above-described flux is preferably 2% by mass or more and 30% by mass or less, more preferably 4% by mass or more and 20% by mass or less, and still more preferably 6% by mass or more and 15% by mass or less with respect to the total amount (100% by mass) of the flux.

In a case where the rosin (P) contains the above-described rosin (PA), a content of the rosin (PA) is preferably 2% by mass or more and 30% by mass or less, more preferably 4% by mass or more and 20% by mass or less, still more preferably 5% by mass or more and 15% by mass or less, particularly preferably 6% by mass or more and 15% by mass or less, and most preferably 8% by mass or more and 15% by mass or less with respect to the total amount (100% by mass) of the flux.

In a case where the rosin (P) contains the above-described rosin (PB), a content of the rosin (PB) is preferably more than 0% by mass and 15% by mass or less, more preferably more than 0% by mass and 10% by mass or less, still more preferably more than 0% by mass and 6% by mass or less, particularly preferably more than 0% by mass and 4% by mass or less, and most preferably more than 0% by mass and 2% by mass or less with respect to the total amount (100% by mass) of the flux.

In the solid content of the above-described flux, the content of the rosin (P) is preferably 15% by mass or more and 95% by mass or less, more preferably 30% by mass or more and 90% by mass or less, and still more preferably 45% by mass or more and 90% by mass or less with respect to the total amount (100% by mass) of the solid content.

In a case where the rosin (P) contains the above-described rosin (PA), the content of the rosin (PA) in the solid content of the flux is preferably 15% by mass or more and 95% by mass or less, more preferably 20% by mass or more and 90% by mass or less, still more preferably 30% by mass or more and 90% by mass or less, particularly preferably 40% by mass or more and 90% by mass or less, and most preferably 50% by mass or more and 90% by mass or less with respect to the total amount (100% by mass) of the solid content.

In a case where the rosin (P) contains the above-described rosin (PB), the content of the rosin (PB) in the solid content of the flux is preferably more than 0% by mass and 50% by mass or less, more preferably more than 0% by mass and 40% by mass or less, still more preferably more than 0% by mass and 30% by mass or less, particularly preferably more than 0% by mass and 20% by mass or less, and most preferably more than 0% by mass and 10% by mass or less, with respect to the total amount (100% by mass) of the solid content.

In a case where the rosin (P) includes the above-described rosin (PA) and the above-described rosin (PB), a mixing ratio of the rosin (PA) and the rosin (PB) in terms of a mass ratio represented by (PA)/(PB) is preferably 4/6 to 9/1, more preferably 5/5 to 9/1, and still more preferably 6/4 to 9/1.

In a case where the above-described mass ratio is within the above-described preferred range, the sticking of the flux residue is more easily reduced.

<Compound (SA)>

The flux according to the present embodiment contains a compound (SA) represented by General Formula (sa).

$$R^{12}-(R^{11}O)_{m}-R^{13} \quad (sa)$$

[in Formula (sa), $R^{11}$ represents a hydrocarbon group which may have a hydroxy group, $R^{12}$ and $R^{13}$ each independently represent a hydrocarbon group having 5 or less carbon atoms, which may have a substituent, a hydroxy group, or a hydrogen atom, and m represents a positive integer]

The hydrocarbon group as $R^{11}$ may be an aliphatic hydrocarbon group or an aromatic hydrocarbon group. The aliphatic hydrocarbon group may be saturated or unsaturated, and usually, it is preferably saturated.

More specifically, as the aliphatic hydrocarbon group, a linear or branched aliphatic hydrocarbon group, an aliphatic hydrocarbon group including a ring in the structure thereof, and the like are exemplary examples.

The number of carbon atoms in the above-described linear or branched aliphatic hydrocarbon group is preferably 1 to 10, more preferably 1 to 6, still more preferably 1 to 4, and most preferably 1 to 3.

The linear aliphatic hydrocarbon group as $R^{11}$ is preferably a linear alkylene group, and specifically, a methylene group [—CH$_2$—], an ethylene group [—(CH$_2$)$_2$—], a trimethylene group [—(CH$_2$)$_3$—], a tetramethylene group [—(CH$_2$)$_4$—], and a pentamethylene group [—(CH$_2$)$_5$—] are exemplary examples. Among these, and an ethylene group [—(CH$_2$)$_2$—] is preferable.

The branched aliphatic hydrocarbon group as $R^{11}$ is preferably a branched alkylene group, and specifically, alkylalkylene groups including an alkylmethylene group such as —CH(CH$_3$)—, —CH$_2$—CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; an alkylethylene group such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$CH$_2$—; an alkyltrimethylene group such as —CH(CH$_3$)CH$_2$CH$_2$— and —CH$_2$CH(CH$_3$)CH$_2$—; and an alkyltetramethylene group such as —CH(CH$_3$)CH$_2$CH$_2$CH$_2$— and —CH$_2$CH(CH$_3$)CH$_2$CH$_2$— are exemplary examples. Among these, —CH$_2$—CH(CH$_3$)— is preferable. As an alkyl group in the alkylalkylene group, a linear alkyl group having 1 to 5 carbon atoms is preferable.

As the above-described aliphatic hydrocarbon group including a ring in the structure thereof, an alicyclic hydrocarbon group (a group obtained by removing two hydrogen atoms from an aliphatic hydrocarbon ring), a group in which an alicyclic hydrocarbon group is bonded to a terminal of a linear or branched aliphatic hydrocarbon group, and a group in which an alicyclic hydrocarbon group is interposed in a linear or branched aliphatic hydrocarbon group are exemplary examples. As the above-described linear or branched aliphatic hydrocarbon group, the same groups as the above-described linear aliphatic hydrocarbon group or the above-described branched aliphatic hydrocarbon group are exemplary examples.

The number of carbon atoms in the alicyclic hydrocarbon group is preferably 3 to 20 and more preferably 3 to 12.

The above-described alicyclic hydrocarbon group may be polycyclic or monocyclic. As the monocyclic alicyclic hydrocarbon group, a group formed by removing two hydrogen atoms from a monocycloalkane is preferable. The above-described monocycloalkane is preferably a monocycloalkane having 3 to 6 carbon atoms, and specifically, cyclopentane, cyclohexane, and the like are exemplary examples. As the polycyclic alicyclic hydrocarbon group, a group formed by removing two hydrogen atoms from a polycycloalkane is preferable. The above-described polycycloalkane is preferably a polycycloalkane having 7 to 12 carbon atoms, and specifically, adamantane, norbornane, isobornane, tricyclodecane, tetracyclododecane, and the like are exemplary examples.

The aromatic hydrocarbon group as the divalent hydrocarbon group in $R^{11}$ is a hydrocarbon group having an aromatic ring.

The number of carbon atoms in the above-described aromatic hydrocarbon group is preferably 3 to 30, more preferably 5 to 30, still more preferably 5 to 20, particularly preferably 6 to 15, and most preferably 6 to 10. Here, the number of carbon atoms does not include the number of carbon atoms in a substituent.

As the aromatic ring included in the aromatic hydrocarbon group, specifically, an aromatic hydrocarbon ring such as benzene, biphenyl, fluorene, naphthalene, anthracene, and phenanthrene; an aromatic heterocyclic ring in which a part of carbon atoms constituting the aromatic hydrocarbon ring is substituted with a hetero atom; and a fused ring in which the aromatic hydrocarbon ring and the aromatic heterocyclic ring are fused are exemplary examples. As the hetero atom in the aromatic heterocyclic ring, an oxygen atom, a sulfur atom, and a nitrogen atom are exemplary examples.

As the above-described aromatic hydrocarbon group, specifically, a group formed by removing two hydrogen atoms from the above-described aromatic hydrocarbon ring (an arylene group); and a group in which one hydrogen atom of a group formed by removing one hydrogen atom from the above-described aromatic hydrocarbon ring (an aryl group) is substituted with an alkylene group (for example, a group formed by further removing one hydrogen atom from an aryl group in an arylalkyl group such as a benzyl group, a phenethyl group, a 1-naphthylmethyl group, a 2-naphthylmethyl group, a 1-naphthylethyl group, and a 2-naphthylethyl group) are exemplary examples. The number of carbon atoms in the above-described alkylene group (an alkyl chain in the arylalkyl group) is preferably 1 to 4, more preferably 1 or 2, and particularly preferably 1.

In the hydrocarbon group described above, $R^{11}$ may be a group in which a hydrogen atom is substituted with a hydroxy group. $R^{11}$ may have a substituent other than the hydroxy group. As the substituent other than the hydroxy group, a carbonyl group, a carboxy group, an amino group, and a halogen atom are exemplary examples. As the halogen atom, a fluorine atom, a chlorine atom, a bromine atom, and an iodine atom are exemplary examples.

As $R^{11}$ having a hydroxy group, —$CH_2$—$CH(OH)$—$CH_2$— is preferable.

In the compound (SA), a plurality of $R^{11}$'s may be the same or different from each other.

In General Formula (sa), in a case where $R^{12}$ is a hydrocarbon group having 5 or less carbon atoms, which may have a substituent, $R^{12}$ is preferably $R^{121}O$—. $R^{121}$ represents a hydrocarbon group having 5 or less carbon atoms, which may have a substituent.

The hydrocarbon group as $R^{121}$ may be an aliphatic hydrocarbon group. The aliphatic hydrocarbon group may be saturated or unsaturated, and usually, it is preferably saturated.

More specifically, as the aliphatic hydrocarbon group, a linear or branched aliphatic hydrocarbon group, an aliphatic hydrocarbon group including a ring in the structure thereof, and the like are exemplary examples.

The number of carbon atoms in the hydrocarbon group as $R^{121}$ is preferably 1 to 3, more preferably 1 or 2, and most preferably 1.

Among these, $R^{12}$ is preferably a hydroxy group.

In General Formula (sa), in a case where $R^{13}$ is a hydrocarbon group having 5 or less carbon atoms, which may have a substituent, $R^{13}$ is preferably —$C(=O)$—$R^{131}$. $R^{131}$ represents a hydrocarbon group having 5 or less carbon atoms, which may have a substituent.

As the hydrocarbon group as $R^{131}$, the same groups as those for the hydrocarbon group as $R^{121}$ are exemplary examples.

The number of carbon atoms in the hydrocarbon group as $R^{131}$ is preferably 1 to 3, more preferably 1 or 2, and most preferably 1.

Among these, $R^{13}$ is preferably a hydrogen atom.

In General Formula (sa), m is not particularly limited as long as the effects of the present invention are exhibited, but may be 1 to 300, preferably 1 to 200, more preferably 2 to 100, still more preferably 2 to 70, particularly preferably 2 to 40, and most preferably 2 to 20.

In General Formula (sa), in a case where $R^{11}$ represents an ethylene group, m is not particularly limited as long as the effects of the present invention are exhibited, but is preferably 2 to 100, more preferably 2 to 70, still more preferably 2 to 40, and particularly preferably 2 to 20.

In General Formula (sa), in a case where $R^{11}$ represents —$CH_2$—$CH(CH_3)$—, m is not particularly limited as long as the effects of the present invention are exhibited, but is preferably 2 to 100, more preferably 2 to 70, still more preferably 2 to 40, and particularly preferably 2 to 20.

In General Formula (sa), in a case where $R^{11}$ represents —$CH_2$—$CH(OH)$—$CH_2$—, m is not particularly limited as long as the effects of the present invention are exhibited, but is preferably 1 to 15, more preferably 1 to 7, and still more preferably 1 to 3.

The flux according to the present embodiment may contain the compound (SA) alone, or may contain two or more of the compounds (SA) having different m values. In a case where the flux according to the present embodiment contains two or more kinds of the compounds (SA), an average molecular weight of the compounds (SA) may be as follows.

In the present specification, the "average molecular weight" means a weight-average molecular weight obtained by a gel permeation chromatography (GPC) measurement. In the present specification, the "average molecular weight" is a PEG-equivalent molecular weight.

The average molecular weight measured by the method is a weight-average molecular weight calculated based on all the compounds (SA) contained in the flux.

The average molecular weight of the compound (SA) is preferably 100 to 4,000, more preferably 100 to 3,600, still more preferably 100 to 1,600, and particularly preferably 100 to 800.

In a case where $R^{11}$ is an ethylene group, the average molecular weight of the compounds (SA) in which $R^{11}$ is an ethylene group is preferably 100 to 4,000, more preferably 100 to 2,000, still more preferably 100 to 1,000, and particularly preferably 100 to 800.

In a case where the average molecular weight is within the above-described range, the adhesion of the dross to the surface of the substrate is more easily suppressed, and the sticking of the flux residue is more easily reduced.

In a case where $R^{11}$ is —$CH_2$—$CH(CH_3)$—, the average molecular weight of the compounds (SA) in which $R^{11}$ is —$CH_2$—$CH(CH_3)$— is preferably 100 to 4,000 and more preferably 300 to 4,000.

In a case where $R^{11}$ is —$CH_2$—$CH(OH)$—$CH_2$—, the average molecular weight of the compounds (SA) in which $R^{11}$ is —$CH_2$—$CH(OH)$—$CH_2$— is preferably 100 to 1,000, more preferably 200 to 600, and still more preferably 200 to 350.

As the compound (SA), polyethylene glycol, polypropylene glycol, polyglycerin, a polyethylene glycol-polypropylene glycol copolymer, and an ethylene oxide-resorcin copolymer are exemplary examples. The above-described copolymer may be any of an alternating copolymer, a random copolymer, or a block copolymer.

In a case where the compound (SA) is polyethylene glycol, a freezing point of the compound (SA) is preferably −100° C. or higher and 60° C. or lower, more preferably −70° C. or higher and 60° C. or lower, still more preferably −70° C. or higher and 48° C. or lower, particularly preferably −70° C. or higher and 30° C. or lower, and most preferably −70° C. or higher and 25° C. or lower.

For the compound (SA), one type may be used alone, or two or more types may be mixed and used.

The compound (SA) preferably includes one or more selected from the group consisting of polyethylene glycol, polypropylene glycol, and polyglycerin, and more preferably includes one or more selected from the group consisting of polyethylene glycol and polypropylene glycol.

In a case where the compound (SA) includes one or more selected from the group consisting of polyethylene glycol and polypropylene glycol, it is easier to suppress the adhesion of the dross to the surface of the substrate, and it is easier to reduce the sticking of the flux residue.

A content of the compound (SA) in the flux is preferably 0.1% by mass or more, more preferably 0.5% by mass or more, and still more preferably 1% by mass or more with respect to the total mass (100% by mass) of the flux.

In the solid content of the flux, the content of the compound (SA) is preferably 0.7% by mass or more, more preferably 3.4% by mass or more, and still more preferably 6.7% by mass or more with respect to the total amount (100% by mass) of the solid content.

In a case where the content of the compound (SA) is equal to or more than the above-described lower limit value, it is easier to suppress the adhesion of the dross to the surface of the substrate in soldering.

The content of the compound (SA) in the flux is preferably 6% by mass or less, more preferably 5% by mass or less, still more preferably 4% by mass or less, particularly preferably 3% by mass or less, and most preferably 2% by mass or less, and may be 1.5% by mass or less with respect to the total mass (100% by mass) of the flux.

The content of the compound (SA) in the flux is preferably 30% by mass or less, more preferably 26% by mass or less, still more preferably 22% by mass or less, particularly preferably 17% by mass or less, and most preferably 12% by mass or less, and may be 9.7% by mass or less with respect to the total amount (100% by mass) of the solid content.

In a case where the content of the compound (SA) is equal to or less than the above-described upper limit value, the sticking of the flux residue is more easily reduced.

The content of the compound (SA) in the flux is preferably 0.1% by mass or more and 6% by mass or less, more preferably 0.5% by mass or more and 4% by mass or less, still more preferably 1% by mass or more and 3% by mass or less, particularly preferably 1% by mass or more and 2% by mass or less, and most preferably 1% by mass or more and 1.5% by mass or less with respect to the total mass (100% by mass) of the flux.

The content of the compound (SA) in the flux is preferably 0.7% by mass or more and 30% by mass or less, more preferably 3.4% by mass or more and 22% by mass or less, still more preferably 6.7% by mass or more and 22% by mass or less, particularly preferably 6.7% by mass or more and 17% by mass or less, and most preferably 6.7% by mass or more and 9.7% by mass or less with respect to the total amount (100% by mass) of the solid content.

In a case where the content of the compound (SA) is equal to or more than the lower limit value of the above-described preferred range, it is easier to suppress the adhesion of the dross to the surface of the substrate, and in a case where the content of the compound (SA) is equal to or less than the upper limit value of the above-described preferred range, it is easier to further reduce the sticking of the flux residue.

The content of the compound (SA) in the flux is preferably 1 part by mass or more, more preferably 5 parts by mass or more, and still more preferably 10 parts by mass or more with respect to 100 parts by mass of the rosin (P). In a case where the content of the compound (SA) is equal to or more than the above-described lower limit value, it is easier to suppress the adhesion of the dross to the surface of the substrate in soldering.

The content of the compound (SA) in the flux is preferably 60 parts by mass or less, more preferably 50 parts by mass or less, still more preferably 40 parts by mass or less, particularly preferably 30 parts by mass or less, and most preferably 20 parts by mass or less, and may be 15 parts by mass or less, may be 10 parts by mass or less, may be 5 parts by mass or less, and may be 1 part by mass or less, with respect to 100 parts by mass of the rosin (P). In a case where the content of the compound (SA) is equal to or less than the above-described upper limit value, the sticking of the flux residue is more easily reduced.

The content of the compound (SA) in the flux is preferably 1 part by mass or more and 60 parts by mass or less, more preferably 5 parts by mass or more and 40 parts by mass or less, still more preferably 10 parts by mass or more and 30 parts by mass or less, particularly preferably 10 parts by mass or more and 20 parts by mass or less, and most preferably 10 parts by mass or more and 15 parts by mass or less with respect to 100 parts by mass of the rosin (P).

In a case where the content of the compound (SA) is equal to or more than the lower limit value of the above-described preferred range, it is easier to suppress the adhesion of the dross to the surface of the substrate in soldering, and in a case where the content of the compound (SA) is equal to or less than the upper limit value of the above-described preferred range, it is easier to further reduce the sticking of the flux residue.

<Activator>

The flux according to the present embodiment contains an activator (provided that a compound corresponding to the above-described compound (SA) is excluded).

As the activator, an organic acid, an amine, and a halogen compound are exemplary examples.

<<Organic Acid>>

As the organic acid, for example, a carboxylic acid, an organic sulfonic acid, and the like are exemplary examples. As the carboxylic acid, for example, an aliphatic carboxylic acid and an aromatic carboxylic acid are exemplary examples. As the aliphatic carboxylic acid, an aliphatic monocarboxylic acid and an aliphatic dicarboxylic acid are exemplary examples.

As the aliphatic monocarboxylic acid, for example, caproic acid, enanthic acid, caprylic acid, pelargonic acid, isopelargonic acid, capric acid, caproic acid, lauric acid (dodecanoic acid), undecanoic acid, lindelic acid, tridecanoic acid, myristoleic acid, pentadecanoic acid, isopalmitic acid, palmitoleic acid, hiragonic acid, hydnocarpic acid, margaric acid, isostearic acid, erucic acid, petroselinic acid, moroctic acid, elaeostearic acid, tariric acid, vaccenic acid, limnoleic acid, vernolic acid, sterculic acid, nonadecanoic acid, eicosanoic acid, stearic acid, 12-hydroxystearic acid, oleic acid, linoleic acid, linolenic acid, myristic acid, 2,2-bis(hydroxymethyl)propionic acid, and 2,2-bis(hydroxymethyl)butanoic acid are exemplary examples.

As the aliphatic dicarboxylic acid, for example, oxalic acid, malonic acid, succinic acid, glutaric acid, adipic acid, pimelic acid, suberic acid, azelaic acid, sebacic acid, dodecanedioic acid, eicosanedioic acid, and tartaric acid are exemplary examples.

As the aromatic carboxylic acid, for example, salicylic acid, dibutylaniline diglycolic acid, terephthalic acid, para-hydroxyphenylacetic acid, phenylsuccinic acid, phthalic acid, benzoic acid, 2,3-dihydroxybenzoic acid, 2,4-diethyl-glutaric acid, 2-quinolinecarboxylic acid, 3-hydroxybenzoic acid, and p-anisic acid are exemplary examples.

In addition, as the carboxylic acid, tris(2-carboxyethyl)isocyanurate, 1,3-cyclohexanedicarboxylic acid, and the like are exemplary examples.

In addition, as the carboxylic acid, dimer acid, trimer acid, hydrogenated dimer acid which is the hydrogenated product obtained by adding hydrogen to dimer acid, and hydrogenated trimer acid which is the hydrogenated product obtained by adding hydrogen to trimer acid are exemplary examples.

As the dimer acid and the trimer acid, for example, dimer acid which is the reaction product of oleic acid and linoleic acid, trimer acid which is the reaction product of oleic acid and linoleic acid, dimer acid which is the reaction product of acrylic acid, trimer acid which is the reaction product of acrylic acid, dimer acid which is the reaction product of methacrylic acid, trimer acid which is the reaction product of methacrylic acid, dimer acid which is the reaction product of acrylic acid and methacrylic acid, trimer acid which is the reaction product of acrylic acid and methacrylic acid, dimer acid which is the reaction product of oleic acid, trimer acid which is the reaction product of oleic acid, dimer acid which is the reaction product of linoleic acid, trimer acid which is the reaction product of linoleic acid, dimer acid which is the reaction product of linolenic acid, trimer acid which is the reaction product of linolenic acid, dimer acid which is the reaction product of acrylic acid and oleic acid, trimer acid which is the reaction product of acrylic acid and oleic acid, dimer acid which is the reaction product of acrylic acid and linoleic acid, trimer acid which is the reaction product of acrylic acid and linoleic acid, dimer acid which is the reaction product of acrylic acid and linolenic acid, trimer acid which is the reaction product of acrylic acid and linolenic acid, dimer acid which is the reaction product of methacrylic acid and oleic acid, trimer acid which is the reaction product of methacrylic acid and oleic acid, dimer acid which is the reaction product of methacrylic acid and linoleic acid, trimer acid which is the reaction product of methacrylic acid and linoleic acid, dimer acid which is the reaction product of methacrylic acid and linolenic acid, trimer acid which is the reaction product of methacrylic acid and linolenic acid, dimer acid which is the reaction product of oleic acid and linolenic acid, trimer acid which is the reaction product of oleic acid and linolenic acid, dimer acid which is the reaction product of linoleic acid and linolenic acid, trimer acid which is the reaction product of linoleic acid and linolenic acid, hydrogenated dimer acid which is the hydrogenated product of each of the above-described dimer acids, and hydrogenated trimer acid which is the hydrogenated product of each of the above-described trimer acid are exemplary examples.

For example, dimer acid, which is the reaction product of oleic acid and linoleic acid, is a dimer having 36 carbon atoms. In addition, trimer acid, which is the reaction product of oleic acid and linoleic acid, is a trimer having 54 carbon atoms.

In addition, as the carboxylic acid, a compound represented by General Formula (a1) is an exemplary example.

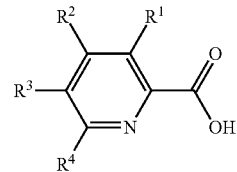

[in Formula (a1), $R^1$, $R^2$, $R^3$, and $R^4$ each independently represent a hydrocarbon group, a hydroxy group, a halogen atom, or a hydrogen atom]

As the hydrocarbon group as $R^1$, $R^2$, $R^3$, and $R^4$, a chain-like hydrocarbon group having 1 to 20 carbon atoms, which may have a substituent, an alicyclic hydrocarbon group having 3 to 20 carbon atoms, which may have a substituent, an amino group, a hydroxy group, and a carboxy group are exemplary examples.

The above-described chain-like hydrocarbon group may be linear or branched. The above-described chain-like hydrocarbon group is a saturated hydrocarbon group or an unsaturated hydrocarbon group, but is preferably a saturated hydrocarbon group.

The alicyclic hydrocarbon group may be a polycyclic group or a monocyclic group. As the monocyclic alicyclic hydrocarbon group, a group formed by removing one or more hydrogen atoms from a monocycloalkane is preferable. As the polycyclic alicyclic hydrocarbon group, a group formed by removing one or more hydrogen atoms from a polycycloalkane is preferable.

As the substituent which can be included in the hydrocarbon group as $R^1$, $R^2$, $R^3$, and $R^4$, an amino group, a hydroxy group, a carboxy group, an acyl group, an alkoxy group, a carbonyl group, and a halogen atom are exemplary examples.

The above-described hydrocarbon group is preferably a chain-like hydrocarbon group having 1 to 5 carbon atoms, which may have a substituent, or a carboxy group. As the above-described chain-like hydrocarbon group, for example, a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, and a neopentyl group are exemplary examples. The above-described hydrocarbon group is preferably a carboxy group.

As the compound represented by General Formula (a1), for example, picolinic acid, dipicolinic acid, and 3-hydroxypicolinic acid are exemplary examples.

The compound represented by General Formula (a1) is preferably picolinic acid. The picolinic acid is a compound in which $R^1$, $R^2$, $R^3$, and $R^4$ in General Formula (a1) are hydrogen atoms.

Alternatively, in the compound represented by General Formula (a1), $R^1$, $R^2$, $R^3$, and $R^4$ are each independently preferably a hydroxy group and more preferably 3-hydroxypicolinic acid.

The 3-hydroxypicolinic acid is a compound in which, in General Formula (a1), $R^1$ is a hydroxy group and $R^2$, $R^3$, and $R^4$ are hydrogen atoms.

As the organic sulfonic acid, for example, an aliphatic sulfonic acid, an aromatic sulfonic acid, and the like are exemplary examples. As the aliphatic sulfonic acid, for example, an alkanesulfonic acid and an alkanolsulfonic acid are exemplary examples.

As the alkanesulfonic acid, for example, methanesulfonic acid, ethanesulfonic acid, 1-propanesulfonic acid, 2-propanesulfonic acid, 1-butanesulfonic acid, 2-butanesulfonic acid, pentanesulfonic acid, hexanesulfonic acid, decanesulfonic acid, and dodecanesulfonic acid are exemplary examples.

As the alkanolsulfonic acid, for example, 2-hydroxyethane-1-sulfonic acid, 2-hydroxypropane-1-sulfonic acid, 2-hydroxybutane-1-sulfonic acid, 2-hydroxypentane-1-sulfonic acid, 1-hydroxypropane-2-sulfonic acid, 3-hydroxypropane-1-sulfonic acid, 4-hydroxybutane-1-sulfonic acid, 2-hydroxyhexane-1-sulfonic acid, 2-hydroxydecane-1-sulfonic acid, and 2-hydroxydodecane-1-sulfonic acid are exemplary examples.

As the aromatic sulfonic acid, for example, 1-naphthalenesulfonic acid, 2-naphthalenesulfonic acid, p-toluenesulfonic acid, xylenesulfonic acid, p-phenolsulfonic acid, cresolsulfonic acid, sulfosalicylic acid, nitrobenzenesulfonic acid, sulfoanthranilic acid, and diphenylamine-4-sulfonic acid are exemplary examples.

For the organic acid, one type may be used alone, or two or more types may be mixed and used.

The organic acid preferably includes one or more selected from the group consisting of an aliphatic carboxylic acid and the compound represented by General Formula (a1).

The aliphatic carboxylic acid preferably includes one or more selected from the group consisting of an aliphatic monocarboxylic acid and an aliphatic dicarboxylic acid.

The compound represented by General Formula (a1) is preferably one or more selected from the group consisting of picolinic acid and dipicolinic acid, and more preferably picolinic acid.

The total content of the organic acid in the above-described flux is preferably 1% by mass or more and 10% by mass or less, more preferably 2% by mass or more and 8% by mass or less, and still more preferably 3% by mass or more and 6% by mass or less with respect to the total mass (100% by mass) of the flux.

In the solid content of the above-described flux, a content of the organic acid is preferably 5% by mass or more and 50% by mass or less, more preferably 10% by mass or more and 40% by mass or less, and still more preferably 15% by mass or more and 35% by mass or less with respect to the total amount (100% by mass) of the solid content.

The content of the compound represented by General Formula (a1) in the flux is preferably 0.05% by mass or more and 1% by mass or less, more preferably 0.1% by mass or more and 0.5% by mass or less, and still more preferably 0.1% by mass or more and 0.3% by mass or less with respect to the total mass (100% by mass) of the flux.

In the solid content of the flux, the content of the compound represented by General Formula (a1) is preferably 0.3% by mass or more and 7% by mass or less, more preferably 0.5% by mass or more and 3% by mass or less, and further more preferably 0.5% by mass or more and 2% by mass or less with respect to the total amount (100% by mass) of the solid content.

<<Amine>>

As the amine, for example, a rosin amine, azoles, guanidines, an alkylamine compound, and an aminoalcohol compound are exemplary examples. As the rosin amine, those described above in <Rosin> are exemplary examples.

As the azoles, for example, 2-methylimidazole, 2-ethylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, a 2,4-diamino-6-[2'-methylimidazolyl-(1')]-ethyl-s-triazine isocyanuric acid adduct, a 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzylimidazolium chloride, 2-methylimidazoline, 2-phenylimidazoline, 2,4-diamino-6-vinyl-s-triazine, a 2,4-diamino-6-vinyl-s-triazine isocyanuric acid adduct, 2,4-diamino-6-methacryloyloxy-ethyl-s-triazine, an epoxy-imidazole adduct, 2-methylbenzimidazole, 2-octylbenzimidazole, 2-pentylbenzimidazole, 2-(1-ethylpentyl)benzimidazole, 2-nonylbenzimidazole, 2-(4-thiazolyl)benzimidazole, benzimidazole, 1,2,4-triazole, 2-(2'-hydroxy-5'-methylphenyl)benzotriazole, 2-(2'-hydroxy-3'-tert-butyl-5'-methylphenyl)-5-chlorobenzotriazole, 2-(2'-hydroxy-3',5'-di-tert-amylphenyl)benzotriazole, 2-(2'-hydroxy-5'-tert-octylphenyl)benzotriazole, 2,2'-methylenebis[6-(2H-benzotriazol-2-yl)-4-tert-octylphenol], 6-(2-benzotriazolyl)-4-tert-octyl-6'-tert-butyl-4'-methyl-2,2'-methylenebisphenol, 1,2,3-benzotriazole, 1-[N,N-bis(2-ethylhexyl)aminomethyl]benzotriazole, carboxybenzotriazole, 1-[N,N-bis(2-ethylhexyl)aminomethyl]methylbenzotriazole, 2,2'-[[(methyl-1H-benzotriazol-1-yl)methyl]imino]bisethanol, 1-(1',2'-dicarboxyethyl)benzotriazole, 1-(2,3-dicarboxypropyl)benzotriazole, 1-[(2-ethylhexylamino)methyl]benzotriazole, 2,6-bis[(1H-benzotriazol-1-yl)methyl]-4-methylphenol, 5-methylbenzotriazole, and 5-phenyltetrazole are exemplary examples.

As the guanidines, for example, 1,3-diphenylguanidine, 1,3-di-o-tolylguanidine, 1-o-tolylbiguanide, 1,3-di-o-cumenylguanidine, and 1,3-di-o-cumenyl-2-propionylguanidine are exemplary examples.

As the alkylamine compound, for example, ethylamine, triethylamine, ethylenediamine, triethylenetetramine, cyclohexylamine, hexadecylamine, and stearylamine are exemplary examples.

As the amino alcohol compound, for example, alkanolamines such as 1-amino-2-propanol, N,N,N',N'-tetrakis(2- hydroxypropyl)ethylenediamine, and monoisopropanolamine are exemplary examples.

For the amine, one type may be used alone, or two or more types may be mixed and used.

The amine is preferably an aminoalcohol compound, more preferably an alkanolamine, and still more preferably 1-amino-2-propanol.

A content of the amine in the flux is preferably 0.05% by mass or more and 2% by mass or less with respect to the total amount (100% by mass) of the flux.

In the solid content of the flux, the content of the amine is preferably 0.5% by mass or more and 10% by mass or less with respect to the total amount (100% by mass) of the solid content.

<<Halogen Compound>>

As the halogen compound, for example, an amine hydrohalic acid salt, and organic halogen compounds other than the amine hydrohalic acid salt are exemplary examples.

An amine hydrohalic acid salt is a compound obtained by reacting an amine with a hydrogen halide.

As the amine herein, aliphatic amines, azoles, and guanidines are exemplary examples. As the hydrogen halide, for example, hydrides of chlorine, bromine, and iodine are exemplary examples.

As the aliphatic amines, for example, ethylamine, diethylamine, triethylamine, and ethylenediamine are exemplary examples.

As the guanidines and azoles, those described above in <<Amines>> are exemplary examples.

As the amine hydrohalic acid salt, more specifically, cyclohexylamine hydrobromide, hexadecylamine hydrobromide, stearylamine hydrobromide, ethylamine hydrobromide, diphenylguanidine hydrobromide, ethylamine hydrochloride, stearylamine hydrochloride, diethylaniline hydrochloride, diethanolamine hydrochloride, 2-ethylhexylamine hydrobromide, pyridine hydrobromide, isopropylamine hydrobromide, diethylamine hydrobromide, dimethylamine hydrobromide, dimethylamine hydrochloride, rosinamine hydrobromide, 2-ethylhexylamine hydrochloride, isopropylamine hydrochloride, cyclohexylamine hydrochloride, 2-pipecoline hydrobromide, 1,3-diphenylguanidine hydrochloride, dimethylbenzylamine hydrochloride, hydrazine hydrate hydrobromide, dimethylcyclohexylamine hydrochloride, trinonylamine hydrobromide, diethylaniline hydrobromide, 2-diethylaminoethanol hydrobromide, 2-diethylaminoethanol hydrochloride, ammonium chloride, diallylamine hydrochloride, diallylamine hydrobromide, diethylamine hydrochloride, triethylamine hydrobromide, triethylamine hydrochloride, hydrazine monohydrochloride, hydrazine dihydrochloride, hydrazine monohydrobromide, hydrazine dihydrobromide, pyridine hydrochloride, aniline hydrobromide, butylamine hydrochloride, hexylamine hydrochloride, n-octylamine hydrochloride, dodecylamine hydrochloride, dimethylcyclohexylamine hydrobromide, ethylenediamine dihydrobromide, rosinamine hydrobromide, 2-phenylimidazole hydrobromide, 4-benzylpyridine hydrobromide, L-glutamic acid hydrochloride, N-methylmorpholine hydrochloride, betaine hydrochloride, 2-pipecoline hydroiodide, cyclohexylamine hydroiodide, 1,3-diphenylguanidine hydrofluoride, diethylamine hydrofluoride, 2-ethylhexylamine hydrofluoride, cyclohexylamine hydrofluoride, ethylamine hydrofluoride, rosinamine hydrofluoride, cyclohexylamine tetrafluoroborate, and dicyclohexylamine tetrafluoroborate are exemplary examples.

Furthermore, as the halogen compound, for example, a salt obtained by reacting an amine with tetrafluoroboric acid ($HBF_4$), and a complex obtained by reacting an amine with boron trifluoride ($BF_3$) can also be used.

As the above-described complex, for example, boron trifluoride piperidine and the like are exemplary examples.

As the organic halogen compound other than the amine hydrohalic acid salt, for example, a halogenated aliphatic compound and the like are exemplary examples. The halogenated aliphatic hydrocarbon group refers to one in which a part or all of hydrogen atoms constituting the aliphatic hydrocarbon group are substituted with halogen atoms.

As the halogenated aliphatic compound, for example, halogenated aliphatic alcohols and halogenated heterocyclic compounds are exemplary examples.

As the halogenated aliphatic alcohol, for example, 1-bromo-2-propanol, 3-bromo-1-propanol, 3-bromo-1,2-propanediol, 1-bromo-2-butanol, 1,3-dibromo-2-propanol, 2,3-dibromo-1-propanol, 1,4-dibromo-2-butanol, and trans-2,3-dibromo-2-butene-1,4-diol are exemplary examples.

As the halogenated heterocyclic compound, for example, a compound represented by General Formula (1H) is an exemplary example.

$$R^{61}\text{—}(R^{62})_n \qquad (1H)$$

[in the formula, $R^{61}$ represents an n-valent heterocyclic group, and $R^{62}$ represents a halogenated aliphatic hydrocarbon group]

As a heterocyclic ring of the n-valent heterocyclic group in $R^{61}$, a ring structure in which a part of carbon atoms constituting an aliphatic hydrocarbon or an aromatic hydrocarbon ring is substituted with a heteroatom is an exemplary example. As the heteroatom in the heterocyclic ring, an oxygen atom, a sulfur atom, and a nitrogen atom are exemplary examples. The heterocyclic ring is preferably a 3- to 10-membered ring, and more preferably a 5- to 7-membered ring. As the heterocyclic ring, for example, an isocyanurate ring and the like are exemplary examples.

The halogenated aliphatic hydrocarbon group in $R^{62}$ preferably has 1 to 10 carbon atoms, more preferably 2 to 6 carbon atoms, and still more preferably 3 to 5 carbon atoms. In addition, $R^{62}$ is preferably a brominated aliphatic hydrocarbon group or a chlorinated aliphatic hydrocarbon group, more preferably a brominated aliphatic hydrocarbon group, and still more preferably a brominated saturated aliphatic hydrocarbon group.

As the halogenated heterocyclic compound, for example, tris-(2,3-dibromopropyl)isocyanurate and the like are exemplary examples.

In addition, as the organic halogen compound other than the amine hydrohalic acid salt, for example, halogenated carboxyl compounds including carboxyl halide compounds such as 2-iodobenzoic acid, 3-iodobenzoic acid, 2-iodopropionic acid, 5-iodosalicylic acid, and 5-iodoanthranilic acid; carboxyl chloride compounds such as 2-chlorobenzoic acid and 3-chloropropionic acid; and carboxyl bromide compounds such as 2,3-dibromopropionic acid, 2,3-dibromosuccinic acid, and 2-bromobenzoic acid are exemplary examples.

For the halogen-based activator, one type may be used alone, or two or more types may be mixed and used.

<Solvent>

The solvent contained in the flux according to the present embodiment is not the compound (SA). As the solvent, for example, water, an alcohol-based solvent, a glycol ether-based solvent, and terpineols are exemplary examples.

As the alcohol-based solvent, for example, ethanol, 1-propanol, 2-propanol, 1,2-butanediol, isobornyl cyclohexanol, 2,4-diethyl-1,5-pentanediol, 2,2-dimethyl-1,3-propanediol, 2,5-dimethyl-2,5-hexanediol, 2,5-dimethyl-3-hexyne-2,5-diol, 2,3-dimethyl-2,3-butanediol, 2-methylpentane-2,4-diol, 1,1,1-tris(hydroxymethyl)propane, 2-ethyl-2-hydroxymethyl-1,3-propanediol, 2,2'-oxybis(methylene)bis(2-ethyl-1,3-propanediol), 2,2-bis(hydroxymethyl)-1,3-propanediol, 1,2,6-trihydroxyhexane, 1-ethynyl-1-cyclohexanol, 1,4-cyclohexanediol, 1,4-cyclohexanedimethanol, and 2,4,7,9-tetramethyl-5-decyne-4,7-diol are exemplary examples.

As the glycol ether-based solvent, for example, diethylene glycol mono-2-ethylhexyl ether, ethylene glycol monophenyl ether, diethylene glycol monohexyl ether (hexyl diglycol), diethylene glycol dibutyl ether, triethylene glycol monobutyl ether, methyl propylene triglycol, butyl propylene triglycol, triethylene glycol butylmethyl ether, and tetraethylene glycol dimethyl ether are exemplary examples.

For the solvent, one type may be used alone, or two or more types may be mixed and used.

From the viewpoint of increasing volatility by preheating, the above-described solvent preferably includes a solvent having a boiling point of 100° C. or lower. The boiling point of the solvent having a boiling point of 100° C. or lower may be 50° C. or higher, 60° C. or higher, or 70° C. or higher. From the viewpoint of solubility of the specific activator, the above-described solvent having a boiling point of 100° C. or lower is preferably an alcohol-based solvent.

The alcohol-based solvent preferably includes at least one selected from the group consisting of ethanol and 2-propanol.

A content of the solvent in the above-described flux is preferably 60% by mass or more and 95% by mass or less, more preferably 70% by mass or more and 95% by mass or less, and still more preferably 80% by mass or more and 95% by mass or less with respect to the total amount (100% by mass) of the flux.

<Other Components>

The flux according to the present embodiment may contain other components as necessary, in addition to the rosin, the activator, and the solvent.

As the other components, a thixotropic agent, a resin component other than the rosin, a metal deactivator, a surfactant, a silane coupling agent, an antioxidant, and a colorant are exemplary examples.

<<Resin Component Other than Rosin>>

As the resin component other than the rosin-based resin, for example, a terpene resin, a modified terpene resin, a terpene phenol resin, a modified terpene phenol resin, a styrene resin, a modified styrene resin, a xylene resin, a modified xylene resin, an acrylic resin, a polyethylene resin, an acrylic-polyethylene copolymer resin, and an epoxy resin are exemplary examples.

As the modified terpene resin, an aromatic modified terpene resin, a hydrogenated terpene resin, and a hydrogenated aromatic modified terpene resin are exemplary examples. As the modified terpene phenol resin, a hydrogenated terpene phenol resin and the like are exemplary examples. As the modified styrene resin, a styrene acrylic resin and a styrene maleic acid resin are exemplary examples. As the modified xylene resin, a phenol-modified xylene resin, an alkylphenol-modified xylene resin, a phenol-modified resol-type xylene resin, a polyol-modified xylene resin, and a polyoxyethylene-added xylene resin are exemplary examples.

<<Metal Deactivator>>

As the metal deactivator, for example, hindered phenolic compounds and nitrogen compounds are exemplary examples.

The term "metal deactivator" herein refers to a compound having a capacity to prevent metal from deteriorating due to contact with a certain type of compound.

The hindered phenolic compound refers to a phenolic compound having a bulky substituent (for example, a branched or cyclic alkyl group such as a t-butyl group) on at least one of the ortho positions of phenol.

The hindered phenolic compound is not particularly limited, and for example, bis[3-(3-tert-butyl-4-hydroxy-5-methylphenyl)propionic acid][ethylenebis(oxyethylene)], N,N'-hexamethylenebis[3-(3,5-di-tert-butyl-4-hydroxyphenyl)propanamide], 1,6-hexanediol bis[3-(3,5-di-tert-butyl-4-hydroxyphenyl)propionate], 2,2'-methylenebis[6-(1-methylcyclohexyl)-p-cresol], 2,2'-methylenebis(6-tert-butyl-p-cresol), 2,2'-methylenebis(6-tert-butyl-4-ethylphenol), triethylene glycol-bis[3-(3-tert-butyl-5-methyl-4-hydroxyphenyl)propionate], 1,6-hexanediol-bis-[3-(3,5-di-tert-butyl-4-hydroxyphenyl)propionate], 2,4-bis-(n-octylthio)-6-(4-hydroxy-3,5-di-t-butylanilino)-1,3,5-triazine, pentaerythrityl-tetrakis[3-(3,5-di-tert-butyl-4-hydroxyphenyl)propionate], 2,2-thio-diethylenebis[3-(3,5-di-tert-butyl-4-hydroxyphenyl)propionate], octadecyl-3-(3,5-di-tert-butyl-4-hydroxyphenyl)propionate, N,N'-hexamethylenebis(3,5-di-t-butyl-4-hydroxy-hydrocinnamamide), 3,5-di-tert-butyl-4-hydroxybenzylphosphonate-diethyl ester, 1,3,5-trimethyl-2,4,6-tris(3,5-di-tert-butyl-4-hydroxybenzyl)benzene, N,N'-bis[2-[2-(3,5-di-tert-butyl-4-hydroxyphenyl)ethylcarbonyloxy]ethyl]oxamide, 2,6-di-tert-butyl-4-methylphenol, and a compound represented by the following chemical formula are exemplary examples.

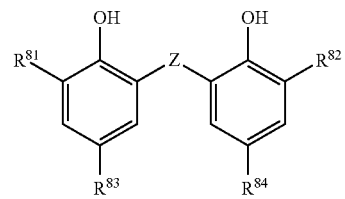

(in the formula, Z is an alkylene group which may be substituted; $R^{81}$ and $R^{82}$ are each independently an alkyl group, an aralkyl group, an aryl group, a heteroaryl group, a cycloalkyl group, or a heterocycloalkyl group, which may be substituted; and $R^{83}$ and $R^{84}$ are each independently an alkyl group which may be substituted)

As the nitrogen compound in the metal deactivator, for example, hydrazide-based nitrogen compounds, amide-based nitrogen compounds, triazole-based nitrogen compounds, and melamine-based nitrogen compounds are exemplary examples.

The hydrazide-based nitrogen compound may be any nitrogen compound having a hydrazide skeleton, and dodecanedioate bis[N2-(2-hydroxybenzoyl)hydrazide], N,N'-bis[3-(3,5-di-tert-butyl-4-hydroxyphenyl)propionyl]hydrazine, decanedicarboxylic acid disalicyloyl hydrazide, N-salicylidene-N'-salicylhydrazide, m-nitrobenzhydrazide, 3-aminophthalhydrazide, phthalic dihydrazide, adipic hydrazide, oxalobis(2-hydroxy-5-octylbenzylidene hydrazide), N'-benzoylpyrrolidonecarboxylic acid hydrazide, and N,N'-bis(3-(3,5-di-tert-butyl-4-hydroxyphenyl)propionyl)hydrazine are exemplary examples.

The amide-based nitrogen compound may be any nitrogen compound having an amide skeleton, and N,N'-bis{2-[3-(3, 5-di-tert-butyl-4-hydroxyphenyl)propionyloxyl]ethyl}oxamide and the like are exemplary examples.

The triazole-based nitrogen compound may be any nitrogen compound having a triazole skeleton, and N-(2H-1,2,4-triazol-5-yl) salicylamide, 3-amino-1,2,4-triazole and 3-(N-salicyloyl)amino-1,2,4-triazole are exemplary examples.

The melamine-based nitrogen compound may be any nitrogen compound having a melamine skeleton, and melamine and melamine derivatives are exemplary examples. More specifically, for example, trisaminotriazine, alkylated trisaminotriazine, alkoxyalkylated trisaminotriazine, melamine, alkylated melamine, alkoxyalkylated melamine, N2-butylmelamine, N2,N2-diethylmelamine, and N,N,N',N',N'',N''-hexakis(methoxymethyl)melamine are exemplary examples.

For the metal deactivator, one type may be used alone, or two or more types may be mixed and used.

<<Surfactant>>

As the surfactant, nonionic surfactants and cationic surfactants are exemplary examples.

As the nonionic surfactant, for example, an aliphatic alcohol polyoxyethylene adduct, an aromatic alcohol polyoxyethylene adduct, a polyhydric alcohol polyoxyethylene adduct, an aliphatic alcohol polyoxypropylene adduct, an aromatic alcohol polyoxypropylene adduct, and a polyhydric alcohol polyoxypropylene adduct are exemplary examples.

As the cationic surfactant, for example, a terminal diamine polyethylene glycol, a terminal diamine polyethylene glycol-polypropylene glycol copolymer, an aliphatic amine polyoxyethylene adduct, an aromatic amine polyoxyethylene adduct, a polyvalent amine polyoxyethylene adduct, and a polyvalent amine polyoxypropylene adduct are exemplary examples.

As surfactants other than the above, for example, polyoxyalkylene acetylene glycols, polyoxyalkylene glyceryl ethers, polyoxyalkylene alkyl ethers, polyoxyalkylene esters, polyoxyalkylene alkylamines, and polyoxyalkylene alkylamides are exemplary examples.

For the surfactant, one type may be used alone, or two or more types may be mixed and used.

A content of the solid content in the flux is preferably 20% by mass or less, more preferably 5% by mass or more and 20% by mass or less, and still more preferably 10% by mass or more and 20% by mass or less with respect to the total amount (100% by mass) of the flux.

In a case where the content of the solid content is within the above-described range, the flux is easily used in flow soldering.

The flux according to the embodiment described above contains the rosin, the compound (SA), the activator, and the solvent, and is suitable for flow soldering.

In the flow soldering, the molten solder is likely to generate an oxide (dross). In a case where the molten solder is brought into contact with the substrate, the dross may adhere to the substrate. In the flux according to the present embodiment, it is possible to suppress the adhesion of the dross to the surface of the substrate after soldering, in the flow soldering.

In particular, in a case where a solder containing Sn and Bi is used, since Bi is easily oxidized, the dross is likely to be formed on the surface of the molten solder. In the flux according to the present embodiment, it is possible to suppress the adhesion of the dross to the surface of the substrate after soldering, even in a case where the solder containing Bi is used. In addition, by performing the soldering using the flux according to the present embodiment, it is possible to obtain an assembly having favorable insulation reliability.

Since the flux according to the embodiment described above contains the compound (SA) and the rosin in combination, it is possible to suppress the adhesion of the dross to the surface of the substrate after soldering and to reduce the sticking of the flux residue.

(Method for Producing Assembly)

The method for producing an assembly according to the second aspect includes a step of soldering a solder alloy to a surface of a substrate treated with the flux according to the first aspect described above to obtain an assembly.

Hereinafter, an embodiment of the method for producing an assembly according to the second aspect will be described.

The method for producing an assembly according to the present embodiment is a method including a component attachment step, a flux application step, a preheating step, and a soldering step in this order.

In the component attachment step, a component is attached to a substrate.

As the substrate, for example, a printed wiring board and the like are exemplary examples.

As the component, for example, an integrated circuit, a transistor, a diode, a resistor, and a capacitor are exemplary examples.

In the flux application step, the flux according to the above-described embodiments is applied onto a soldering surface of the substrate on which the component has been mounted.

As a flux application device, a spray fluxer, a foam fluxer, and the like are exemplary examples. Among these, from the viewpoint of stability of the application amount, a spray fluxer is preferable.

From the viewpoint of solderability, the application amount of the flux is preferably 30 to 180 mL/m$^2$, more preferably 40 to 150 mL/m$^2$, and particularly preferably 50 to 120 mL/m$^2$.

In the preheating step, the substrate on which the component has been mounted is preheated. The temperature for heating the substrate in the preheating step is preferably 80° C. to 130° C. and more preferably 90° C. to 120° C.

In the soldering step, the soldering surface of the substrate on which the component has been mounted is brought into contact with a molten solder obtained by melting a solder alloy.

The method of bringing the soldering surface into contact with the molten solder may be any method as long as the molten solder can be brought into contact with the substrate, and is not particularly limited. As such a method, for example, a jetting method and an immersion method are exemplary examples.

The jetting method is a method of bringing the soldering surface of the substrate on which the component has been mounted into contact with a jetting molten solder. The immersion method is a method of bringing the soldering surface of the substrate on which the component has been mounted into contact with a liquid surface of a stationary molten solder.

As the solder alloy, a solder alloy having a known composition can be used.

The solder alloy may be an Sn simple substance solder, may be an Sn—Ag-based solder alloy, an Sn—Cu-based solder alloy, an Sn—Ag—Cu-based solder alloy, an Sn—Bi-based solder alloy, an Sn—In-based solder alloy, or the like, or may be a solder alloy obtained by adding Sb, Bi, In, Cu, Zn, As, Ag, Cd, Fe, Ni, Co, Au, Ge, P, or the like to these alloys.

The solder alloy may be an Sn—Pb-based solder alloy or an Sn—Pb-based solder alloy, to which Sb, Bi, In, Cu, Zn, As, Ag, Cd, Fe, Ni, Co, Au, Ge, P, or the like is added. The solder alloy is preferably a solder alloy containing no Pb, and more preferably a solder alloy containing Sn and Bi.

Conditions for the soldering in the soldering step may be appropriately set according to a melting point of the solder. For example, in a case where an Sn—Ag—Cu-based solder alloy is used, the temperature of the molten solder is preferably 230° C. to 280° C. and more preferably 250° C. to 270° C. Alternatively, in a case where an Sn—Bi-based solder alloy (solder alloy containing Sn and Bi) is used, the temperature of the molten solder is preferably 170° C. to 220° C. and more preferably 180° C. to 200° C.

According to the method for producing an assembly according to the present embodiment described above, it is possible to suppress the adhesion of the dross to the surface of the substrate after soldering. According to the method for producing an assembly according to the present embodiment, it is possible to suppress the adhesion of the dross to the surface of the substrate, even in a case where the solder alloy containing Sn and Bi is used. Therefore, it is possible to produce an assembly having an increased joining strength. In addition, it is possible to produce an assembly that is unlikely to cause short-circuit and deterioration of insulation properties.

EXAMPLES

Hereinafter, the present invention will be described with reference to Examples, but the present invention is not limited to the following Examples.
<Preparation of Flux>

Examples 1 to 27 and Comparative Examples 1 to 6

Each flux of Examples and Comparative Examples was prepared with the composition shown in Tables 2 to 7.
Raw materials used are described below.
The type of the rosin used and the softening point thereof are as follows.
Rosin (P):
  Acrylic acid-modified hydrogenated rosin (softening point: 130° C.)
  Polymerized rosin (softening point: 139° C.)
  Hydrogenated rosin (softening point: 74° C.)
  Rosin ester (softening point: 90° C.)
A softening point of the above-described rosin was measured by the ring and ball method described in JIS K 5902.

Specifically, first, a sample to be measured was quickly fused at as low a temperature as possible, and then a ring was carefully filled with the fused sample so that no bubbles were formed in the ring placed on a flat metal plate. After cooling, a slightly heated small knife was used to cut off a raised portion from a flat surface including the upper end of the ring. Next, a support (ring stand) was put into a glass container (heating bath) having a diameter of 85 mm or more and a height of 127 mm or more, and the heat medium was poured until the depth is to be 90 mm or more. Next, a steel ball (diameter: 9.5 mm, weight: 3.5 g) and the ring filled with the sample were immersed in the heat medium so as not to come into contact with each other, and the temperature of the heat medium was maintained at 20° C.±5° C. for 15 minutes. Next, the steel ball was placed on the center of the surface of the sample in the ring, and the steel ball was placed at a fixed position on the support. Next, a distance from the upper end of the ring to the heat medium surface was maintained at 50 mm, a thermometer was placed, a position of a center of a mercury ball of the thermometer was set to the same height as the center of the ring, and the container was heated. Flame of the Bunsen burner used for the heating was located at the center between the center and the edge of the bottom of the container to make the heating uniform. The rate of increase in the bath temperature after the heating started and reached 40° C. was set to 5.0±0.5° C. per minute. The temperature at which the sample gradually softened, flowed down from the ring, and finally came into contact with the bottom plate was read, and this temperature was defined as the softening point.

For a rosin having a softening point of 80° C. or lower, the softening point was measured in a water bath using water as the heat medium. In addition, for a rosin having a softening point of higher than 80° C., the softening point was measured in a glycerin bath using glycerin as the heat medium. The measurement was performed twice for each rosin. The above-described softening point is an average value of two measured values.

Compound (SA): polyethylene glycol (PEG), polypropylene glycol (PPG), or polyglycerin was used.

PEG is a compound in which $R^{11}O$ in General Formula (sa) is $-(CH_2)_2-O-$.

PPG is a compound in which $R^{11}O$ in General Formula (sa) is $-CH_2-CH(CH_3)-O-$.

The polyglycerin is a compound in which $R^{11}O$ in General Formula (sa) is $-CH_2-CH(OH)-CH_2-O-$.

In the PEG, PPG, and polyglycerin, $R^{12}$ is a hydroxy group, and $R^{13}$ is a hydrogen atom.

Specifically, the followings were used.

As the PEG, PEG 200 (manufactured by SANYO CHEMICAL INDUSTRIES, LTD.), PEG 400 (manufactured by SANYO CHEMICAL INDUSTRIES, LTD.), PEG 600 (manufactured by SANYO CHEMICAL INDUSTRIES, LTD.), PEG 1500 (manufactured by SANYO CHEMICAL INDUSTRIES, LTD.), PEG 1540 (manufactured by SANYO CHEMICAL INDUSTRIES, LTD.), or PEG 4000S (manufactured by SANYO CHEMICAL INDUSTRIES, LTD.) were used.

As the PPG, PPG 400 (manufactured by Wako Pure Chemical Corporation), PPG 1000 (manufactured by Wako Pure Chemical Corporation), or PPG 3000 (manufactured by Wako Pure Chemical Corporation) was used.

As the polyglycerin, a mixture of trimer to hexamer was used.

Comparative compound: polyoxyethylene behenyl ether, polyethylene glycol stearate, diglycerin monoester, sorbitan monolaurate, or sorbitan monostearate The chemical formula of each of the comparative compounds is as follows, and does not correspond to General Formula (sa).

The polyoxyethylene behenyl ether is a compound represented by Formula (1).

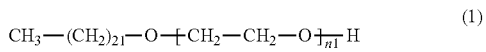

$$CH_3-(CH_2)_{21}-O-(CH_2-CH_2-O)_{\overline{n1}}H \qquad (1)$$

[in Formula (1), n1 is 25 to 35]

The polyethylene glycol stearate is a compound represented by Formula (2).

(2)

[in Formula (2), n2 is 100 to 150]

The diglycerin monoester is a compound represented by Formula (3).

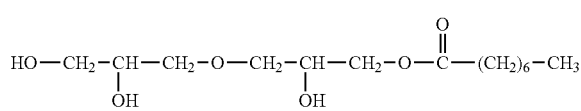

(3)

The sorbitan monolaurate is a compound represented by Formula (4).

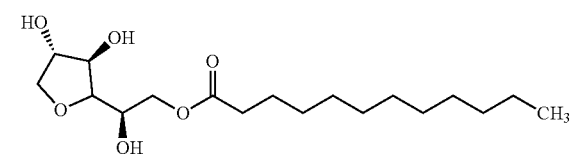

(4)

The sorbitan monostearate is a compound represented by Formula (5).

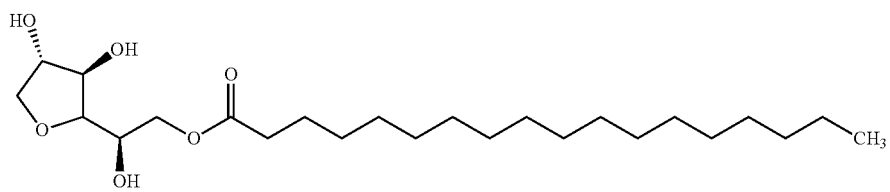

(5)

Activator: picolinic acid, 1-amino-2-propanol, or adipic acid

Solvent: 2-propanol or ethanol

The average molecular weight of the compound (SA) and the comparative compound described above was measured by gel permeation chromatography (GPC). The average molecular weight is a PEG-equivalent molecular weight. The equipment and measurement conditions used in the GPC measurement were as follows. The measurement results are shown in Table 1. In Table 1, Mw represents a weight-average molecular weight. In addition, a freezing point of each PEG is shown together.

Analysis device: EcoSEC HLC-8320GPC, manufactured by Tosoh Corporation

Mobile phase: tetrahydrofuran

Column: TSK guard column HXL manufactured by Tosoh Corporation, TSKgel G2000 HXL manufactured by Tosoh Corporation, and TSKgel G1000 HXL manufactured by Tosoh Corporation Column temperature: 40° C.

Flow rate: 1.0 (mL/min), reference: 1/3

Detector: RI, Pol(+), Res(0.5 s)

Injection volume: 50 μL

TABLE 1

| | Mw | Freezing point |
|---|---|---|
| PEG200 | 196 | −60° C. |
| PEG400 | 414 | 6° C. |
| PEG600 | 587 | 20° C. |
| PEG1500 | 950 | 40° C. |
| PEG1540 | 1339 | 45° C. |
| PEG4000S | 3523 | 56° C. |
| PPG400 | 463 | — |
| PPG1000 | 988 | — |
| PPG3000 | 3249 | — |
| Polyglycerin | 326 | — |
| Polyoxyethylene behenyl ether | 1726 | — |
| Polyethylene glycol stearate | 6444 | — |

<Preparation of Molten Solder>

As a base alloy, an ingot made of an alloy containing 58% by mass of Bi and the remainder of Sn was prepared. The ingot was melted to prepare a molten solder.

According to the evaluation methods described in <Evaluation> below, <<Evaluation of ability to suppress adhesion of dross>> and <<Evaluation of sticking of flux residue>> were performed. The evaluation results are shown in Tables 2 to 7.

<Evaluation>

<<Evaluation of Ability to Suppress Adhesion of Dross>>

(1) Evaluation Method 0.15 mL of the flux of each of Examples was applied onto a glass substrate (50 mm×50 mm, thickness: 0.7 mm). The obtained substrate was heated and dried at 100° C. for 5 minutes to obtain a pre-treated substrate.

Next, the pre-treated substrate was immersed in a molten solder of a small jet solder bath for 5 seconds in an air atmosphere.

The presence or absence of the dross on the substrate was visually confirmed, and the evaluation was performed based on the following determination standard.

(2) Determination Standard

A: no dross was confirmed.

B: dross was slightly confirmed.

C: small amount of dross was confirmed.

D: large amount of dross was confirmed.

In the evaluation results, the amount of dross adhering to the substrate increases in the order of A to D. The flux with an evaluation result of A to C was regarded as acceptable, and the flux with an evaluation result of D was regarded as unacceptable.

<<Evaluation of Sticking of Flux Residue>>
Evaluation Method 0.15 mL of the flux of each of Examples was applied onto a glass epoxy substrate (50 mm×50 mm, thickness: 1 mm, and heated and dried to obtain a pre-treated substrate. For each of the pre-treated substrates, the sticking of the flux residue was measured according to the following procedure.

The pre-treated substrate was left to stand on a base heated to 60° C. for 3 minutes, and then sticking was measured. The sticking was measured under the following conditions using the following device. In Tables 2 to 7, the unit of the measured value of sticking is gf. Here, 1 [gf]=9.8×10$^{-3}$ [N].

Device: tackiness tester (Malcom, model number: TK-1)
New penetration method: constant-pressure penetration method
Press time: 0.2 sec
Pressing force: 50 gf
Penetration speed: 2.0 mm/sec
Peeling speed: 10 mm/sec

TABLE 2

|  |  | Example 1 | Example 2 | Example 3 | Example 4 | Example 5 | Example 6 | Example 7 |
|---|---|---|---|---|---|---|---|---|
| Rosin (P) | Acrylic acid-modified hydrogenated rosin | 5 | 8 |  | 4 | 9 | 6 | 6 |
|  | Polymerized rosin |  |  | 6 |  |  |  |  |
|  | Hydrogenated rosin | 5 | 2 | 4 | 6 | 1 | 4 | 4 |
|  | Rosin ester |  |  |  |  |  |  |  |
| Compound (SA) | PEG400 | 1 | 1 | 1 | 1 | 1 | 1 | 1 |
|  | PEG200 |  |  |  |  |  |  |  |
|  | PEG600 |  |  |  |  |  |  |  |
|  | PEG1500 |  |  |  |  |  |  |  |
|  | PEG1540 |  |  |  |  |  |  |  |
|  | PEG4000S |  |  |  |  |  |  |  |
|  | PPG400 |  |  |  |  |  |  |  |
|  | PPG1000 |  |  |  |  |  |  |  |
|  | PPG3000 |  |  |  |  |  |  |  |
|  | Polyglycerin |  |  |  |  |  |  |  |
| Comparative compound | Polyoxyethylene behenyl ether |  |  |  |  |  |  |  |
|  | Polyethylene glycol stearate |  |  |  |  |  |  |  |
|  | Diglycerin monoester |  |  |  |  |  |  |  |
|  | Sorbitan monolaurate |  |  |  |  |  |  |  |
|  | Sorbitan monostearate |  |  |  |  |  |  |  |
| Activator | Picolinic acid | 0.2 | 0.2 | 0.2 | 0.2 | 0.2 | 0.2 | 0.2 |
|  | 1-Amino-2-propanol | 0.2 | 0.2 | 0.2 | 0.2 | 0.2 | 0.2 | 0.2 |
|  | Adipic acid | 3.5 | 3.5 | 3.5 | 3.5 | 3.5 | 3.5 |  |
| Solvent | 2-Propanol | 85.1 | 85.1 | 85.1 | 85.1 | 85.1 |  | 88.6 |
|  | Ethanol |  |  |  |  |  | 85.1 |  |
| Total (% by mass) |  | 100 | 100 | 100 | 100 | 100 | 100 | 100 |
| Total amount of solid content/total amount of flux (% by mass) |  | 14.9 | 14.9 | 14.9 | 14.9 | 14.9 | 14.9 | 11.4 |
| Compound (SA)/total amount of rosin (part by mass) |  | 10.0 | 10.0 | 10.0 | 10.0 | 10.0 | 10.0 | 10.0 |
| Total amount of rosin/total amount of solid content (% by mass) |  | 67.1 | 67.1 | 67.1 | 67.1 | 67.1 | 67.1 | 87.7 |
| Compound (SA)/total amount of solid content (% by mass) |  | 6.7 | 6.7 | 6.7 | 6.7 | 6.7 | 6.7 | 8.8 |
| Evaluation result | Evaluation of ability to suppress adhesion of dross | A | A | A | A | A | A | A |
|  | Evaluation of sticking of flux residue | 8.8 | 4.8 | 4.7 | 13.9 | 4.8 | 4.9 | 2.7 |

TABLE 3

|  |  | Example 8 | Example 9 | Example 10 | Example 11 | Example 12 |
|---|---|---|---|---|---|---|
| Rosin (P) | Acrylic acid-modified hydrogenated rosin | 6 | 6 | 6 | 6 | 6 |
|  | Polymerized rosin |  |  |  |  |  |
|  | Hydrogenated rosin | 3 | 3 | 3 | 3 | 3 |
|  | Rosin ester | 1 | 1 | 1 | 1 | 1 |

TABLE 3-continued

|  |  | Example 8 | Example 9 | Example 10 | Example 11 | Example 12 |
|---|---|---|---|---|---|---|
| Compound (SA) | PEG400 | 1 | 0.1 | 0.5 | 1.5 | 2 |
|  | PEG200 |  |  |  |  |  |
|  | PEG600 |  |  |  |  |  |
|  | PEG1500 |  |  |  |  |  |
|  | PEG1540 |  |  |  |  |  |
|  | PEG4000S |  |  |  |  |  |
|  | PPG400 |  |  |  |  |  |
|  | PPG1000 |  |  |  |  |  |
|  | PPG3000 |  |  |  |  |  |
|  | Polyglycerin |  |  |  |  |  |
| Comparative compound | Polyoxyethylene behenyl ether |  |  |  |  |  |
|  | Polyethylene glycol stearate |  |  |  |  |  |
|  | Diglycerin monoester |  |  |  |  |  |
|  | Sorbitan monolaurate |  |  |  |  |  |
|  | Sorbitan monostearate |  |  |  |  |  |
| Activator | Picolinic acid | 0.2 | 0.2 | 0.2 | 0.2 | 0.2 |
|  | 1-Amino-2-propanol | 0.2 | 0.2 | 0.2 | 0.2 | 0.2 |
|  | Adipic acid | 3.5 | 3.5 | 3.5 | 3.5 | 3.5 |
| Solvent | 2-Propanol | 85.1 | 86 | 85.6 | 84.6 | 84.1 |
|  | Ethanol |  |  |  |  |  |
|  | Total (% by mass) | 100 | 100 | 100 | 100 | 100 |
|  | Total amount of solid content/total amount of flux (% by mass) | 14.9 | 14 | 14.4 | 15.4 | 15.9 |
|  | Compound (SA)/total amount of rosin (part by mass) | 10.0 | 1.0 | 5.0 | 15.0 | 20.0 |
|  | Total amount of rosin/total amount of solid content (% by mass) | 67.1 | 71.4 | 69.4 | 64.9 | 62.9 |
|  | Compound (SA)/total amount of solid content (% by mass) | 6.7 | 0.7 | 3.5 | 9.7 | 12.6 |
| Evaluation result | Evaluation of ability to suppress adhesion of dross | A | C | B | A | A |
|  | Evaluation of sticking of flux residue | 10.4 | 2.5 | 4.7 | 12.7 | 16.7 |

TABLE 4

|  |  | Example 13 | Example 14 | Example 15 | Example 16 | Example 17 |
|---|---|---|---|---|---|---|
| Rosin (P) | Acrylic acid-modified hydrogenated rosin | 6 | 6 | 6 | 6 | 10 |
|  | Polymerized rosin |  |  |  |  |  |
|  | Hydrogenated rosin | 3 | 3 | 3 | 3 |  |
|  | Rosin ester | 1 | 1 | 1 | 1 |  |
| Compound (SA) | PEG400 | 3 | 4 | 5 | 6 | 0.5 |
|  | PEG200 |  |  |  |  |  |
|  | PEG600 |  |  |  |  |  |
|  | PEG1500 |  |  |  |  |  |
|  | PEG1540 |  |  |  |  |  |
|  | PEG4000S |  |  |  |  |  |
|  | PPG400 |  |  |  |  |  |
|  | PPG1000 |  |  |  |  |  |
|  | PPG3000 |  |  |  |  |  |
|  | Polyglycerin |  |  |  |  |  |
| Comparative compound | Polyoxyethylene behenyl ether |  |  |  |  |  |
|  | Polyethylene glycol stearate |  |  |  |  |  |
|  | Diglycerin monoester |  |  |  |  |  |
|  | Sorbitan monolaurate |  |  |  |  |  |
|  | Sorbitan monostearate |  |  |  |  |  |
| Activator | Picolinic acid | 0.2 | 0.2 | 0.2 | 0.2 | 0.2 |
|  | 1-Amino-2-propanol | 0.2 | 0.2 | 0.2 | 0.2 | 0.2 |
|  | Adipic acid | 3.5 | 3.5 | 3.5 | 3.5 | 3.5 |
| Solvent | 2-Propanol | 83.1 | 82.1 | 81.1 | 80.1 | 85.6 |
|  | Ethanol |  |  |  |  |  |
|  | Total (% by mass) | 100 | 100 | 100 | 100 | 100 |
|  | Total amount of solid content/total amount of flux (% by mass) | 16.9 | 17.9 | 18.9 | 19.9 | 14.4 |
|  | Compound (SA)/total amount of rosin (part by mass) | 30.0 | 40.0 | 50.0 | 60.0 | 5.0 |
|  | Total amount of rosin/total amount of solid content (% by mass) | 59.2 | 55.9 | 52.9 | 50.3 | 69.4 |

TABLE 4-continued

|  |  | Example 13 | Example 14 | Example 15 | Example 16 | Example 17 |
|---|---|---|---|---|---|---|
|  | Compound (SA)/total amount of solid content (% by mass) | 17.8 | 22.3 | 26.5 | 30.2 | 3.5 |
| Evaluation result | Evaluation of ability to suppress adhesion of dross | A | A | A | A | C |
|  | Evaluation of sticking of flux residue | 20.2 | 32.9 | 40.6 | 48.6 | 4.6 |

TABLE 5

|  |  | Example 18 | Example 19 | Example 20 | Example 21 | Example 22 |
|---|---|---|---|---|---|---|
| Rosin (P) | Acrylic acid-modified hydrogenated rosin | 6 | 6 | 6 | 6 | 6 |
|  | Polymerized rosin |  |  |  |  |  |
|  | Hydrogenated rosin | 3 | 3 | 3 | 3 | 3 |
|  | Rosin ester | 1 | 1 | 1 | 1 | 1 |
| Compound (SA) | PEG400 |  |  |  |  |  |
|  | PEG200 | 1 |  |  |  |  |
|  | PEG600 |  | 1 |  |  |  |
|  | PEG1500 |  |  | 1 |  |  |
|  | PEG1540 |  |  |  | 1 |  |
|  | PEG4000S |  |  |  |  | 1 |
|  | PPG400 |  |  |  |  |  |
|  | PPG1000 |  |  |  |  |  |
|  | PPG3000 |  |  |  |  |  |
|  | Polyglycerin |  |  |  |  |  |
| Comparative compound | Polyoxyethylene behenyl ether |  |  |  |  |  |
|  | Polyethylene glycol stearate |  |  |  |  |  |
|  | Diglycerin monoester |  |  |  |  |  |
|  | Sorbitan monolaurate |  |  |  |  |  |
|  | Sorbitan monostearate |  |  |  |  |  |
| Activator | Picolinic acid | 0.2 | 0.2 | 0.2 | 0.2 | 0.2 |
|  | 1-Amino-2-propanol | 0.2 | 0.2 | 0.2 | 0.2 | 0.2 |
|  | Adipic acid | 3.5 | 3.5 | 3.5 | 3.5 | 3.5 |
| Solvent | 2-Propanol | 85.1 | 85.1 | 85.1 | 85.1 | 85.1 |
|  | Ethanol |  |  |  |  |  |
|  | Total (% by mass) | 100 | 100 | 100 | 100 | 100 |
|  | Total amount of solid content/total amount of flux (% by mass) | 14.9 | 14.9 | 14.9 | 14.9 | 14.9 |
|  | Compound (SA)/total amount of rosin (part by mass) | 10.0 | 10.0 | 10.0 | 10.0 | 10.0 |
|  | Total amount of rosin/total amount of solid content (% by mass) | 67.1 | 67.1 | 67.1 | 67.1 | 67.1 |
|  | Compound (SA)/total amount of solid content (% by mass) | 6.7 | 6.7 | 6.7 | 6.7 | 6.7 |
| Evaluation result | Evaluation of ability to suppress adhesion of dross | A | A | B | B | C |
|  | Evaluation of sticking of flux residue | 10.4 | 10.2 | 12.2 | 13.4 | 5.9 |

TABLE 6

|  |  | Example 23 | Example 24 | Example 25 | Example 26 | Example 27 |
|---|---|---|---|---|---|---|
| Rosin (P) | Acrylic acid-modified hydrogenated rosin | 6 | 6 | 6 | 6 |  |
|  | Polymerized rosin |  |  |  |  |  |
|  | Hydrogenated rosin | 3 | 3 | 3 | 3 | 10 |
|  | Rosin ester | 1 | 1 | 1 | 1 |  |
| Compound (SA) | PEG400 |  |  |  |  | 1 |
|  | PEG200 |  |  |  |  |  |
|  | PEG600 |  |  |  |  |  |
|  | PEG1500 |  |  |  |  |  |
|  | PEG1540 |  |  |  |  |  |
|  | PEG4000S |  |  |  |  |  |

TABLE 6-continued

|  |  | Example 23 | Example 24 | Example 25 | Example 26 | Example 27 |
|---|---|---|---|---|---|---|
|  | PPG400 | 1 |  |  |  |  |
|  | PPG1000 |  | 1 |  |  |  |
|  | PPG3000 |  |  | 1 |  |  |
|  | Polyglycerin |  |  |  | 1 |  |
| Comparative compound | Polyoxyethylene behenyl ether |  |  |  |  |  |
|  | Polyethylene glycol stearate |  |  |  |  |  |
|  | Diglycerin monoester |  |  |  |  |  |
|  | Sorbitan monolaurate |  |  |  |  |  |
|  | Sorbitan monostearate |  |  |  |  |  |
| Activator | Picolinic acid | 0.2 | 0.2 | 0.2 | 0.2 | 0.2 |
|  | 1-Amino-2-propanol | 0.2 | 0.2 | 0.2 | 0.2 | 0.2 |
|  | Adipic acid | 3.5 | 3.5 | 3.5 | 3.5 | 3.5 |
| Solvent | 2-Propanol | 85.1 | 85.1 | 85.1 | 85.1 | 85.1 |
|  | Ethanol |  |  |  |  |  |
|  | Total (% by mass) | 100 | 100 | 100 | 100 | 100 |
|  | Total amount of solid content/total amount of flux (% by mass) | 14.9 | 14.9 | 14.9 | 14.9 | 14.9 |
|  | Compound (SA)/total amount of rosin (part by mass) | 10.0 | 10.0 | 10.0 | 10.0 | 10.0 |
|  | Total amount of rosin/total amount of solid content (% by mass) | 67.1 | 67.1 | 67.1 | 67.1 | 67.1 |
|  | Compound (SA)/total amount of solid content (% by mass) | 6.7 | 6.7 | 6.7 | 6.7 | 6.7 |
| Evaluation result | Evaluation of ability to suppress adhesion of dross | A | A | A | C | A |
|  | Evaluation of sticking of flux residue | 10.5 | 10.9 | 10.9 | 13.5 | 78.3 |

TABLE 7

|  |  | Comparative Example 1 | Comparative Example 2 | Comparative Example 3 | Comparative Example 4 | Comparative Example 5 | Comparative Example 6 |
|---|---|---|---|---|---|---|---|
| Rosin (P) | Acrylic acid-modified hydrogenated rosin | 6 | 6 | 6 | 6 | 6 | 6 |
|  | Polymerized rosin |  |  |  |  |  |  |
|  | Hydrogenated rosin | 3 | 3 | 3 | 3 | 3 | 3 |
|  | Rosin ester | 1 | 1 | 1 | 1 | 1 | 1 |
| Compound (SA) | PEG400 |  |  |  |  |  |  |
|  | PEG200 |  |  |  |  |  |  |
|  | PEG600 |  |  |  |  |  |  |
|  | PEG1500 |  |  |  |  |  |  |
|  | PEG1540 |  |  |  |  |  |  |
|  | PEG4000S |  |  |  |  |  |  |
|  | PPG400 |  |  |  |  |  |  |
|  | PPG1000 |  |  |  |  |  |  |
|  | PPG3000 |  |  |  |  |  |  |
|  | Polyglycerin |  |  |  |  |  |  |
| Comparative compound | Polyoxyethylene behenyl ether | 1 |  |  |  |  |  |
|  | Polyethylene glycol stearate |  | 1 |  |  |  |  |
|  | Diglycerin monoester |  |  | 1 |  |  |  |
|  | Sorbitan monolaurate |  |  |  | 1 |  |  |
|  | Sorbitan monostearate |  |  |  |  | 1 |  |
| Activator | Picolinic acid | 0.2 | 0.2 | 0.2 | 0.2 | 0.2 | 0.2 |
|  | 1-Amino-2-propanol | 0.2 | 0.2 | 0.2 | 0.2 | 0.2 | 0.2 |
|  | Adipic acid | 3.5 | 3.5 | 3.5 | 3.5 | 3.5 | 3.5 |
| Solvent | 2-Propanol | 85.1 | 85.1 | 85.1 | 85.1 | 85.1 | 86.1 |
|  | Ethanol |  |  |  |  |  |  |
|  | Total (% by mass) | 100 | 100 | 100 | 100 | 100 | 100 |
|  | Total amount of solid content/total amount of flux (% by mass) | 14.9 | 14.9 | 14.9 | 14.9 | 14.9 | 13.9 |

TABLE 7-continued

| | Comparative Example 1 | Comparative Example 2 | Comparative Example 3 | Comparative Example 4 | Comparative Example 5 | Comparative Example 6 |
|---|---|---|---|---|---|---|
| Compound (SA)/total amount of rosin (part by mass) | 0.0 | 0.0 | 0.0 | 0.0 | 0.0 | 0.0 |
| Total amount of rosin/total amount of solid content (% by mass) | 67.1 | 67.1 | 67.1 | 67.1 | 67.1 | 71.9 |
| Compound (SA)/total amount of solid content (% by mass) | 0.0 | 0.0 | 0.0 | 0.0 | 0.0 | 0.0 |
| Evaluation result — Evaluation of ability to suppress adhesion of dross | D | D | D | D | D | D |
| Evaluation of sticking of flux residue | 12.7 | 5.8 | 12.9 | 10.3 | 8.8 | 2.5 |

It was confirmed that the fluxes of Examples 1 to 27, containing the rosin, the compound (SA), the activator, and the solvent, had a higher ability to suppress the adhesion of dross than the fluxes of Comparative Examples 1 to 6, not containing the compound (SA).

The reason why such an effect is obtained is not clear, but it is presumed as follows.

In the compound (SA), both $R^{12}$ and $R^{13}$ are a hydrocarbon group having 5 or less carbon atoms, a hydroxy group, or a hydrogen atom, the compound (SA) has low hydrophobicity and low compatibility with the rosin. Therefore, the rosin and the compound (SA) are separated from each other, and a layer of the compound (SA) is easily formed on the layer of the rosin. As a result, the dross present on the surface of the molten solder is likely to flow out to the solder bath together with the layer of the compound (SA).

On the other hand, the comparative compound has an alkyl group having 6 or more carbon atoms, has high hydrophobicity, and has high compatibility with the rosin. Therefore, the rosin and the compound (SA) are compatible with each other, and thus the layer of the comparative compound is not easily formed. As a result, the dross present on the surface of the molten solder is likely to remain adhered to the flux applied to the substrate.

From the results of Examples 1, 2, 4, 5, and 27 in which the rosin (PB) and the rosin (PA) were used in combination as the rosin (P), in a case where the mixing ratio of the rosin (PA) having a softening point of higher than 100° C. and the rosin (PB) having a softening point of 100° C. or lower in terms of a mass ratio represented by (PA)/(PB) was (PA)/(PB)=4/6 or more, the sticking of the flux residue was reduced; in a case of being 5/5 or more, the sticking of the flux residue was further reduced; and in a case of being 8/2 or more, the sticking of the flux residue was particularly reduced.

INDUSTRIAL APPLICABILITY

According to the present invention, it is possible to provide a flux and a method for producing an assembly, which can suppress adhesion of dross to a surface of a substrate in soldering. The flux is suitable for flow soldering. In addition, the flux is also suitable for flow soldering using a lead-free solder.

What is claimed is:

1. A flux comprising:

a rosin (P);

a compound (SA) represented by General Formula (sa);

an activator, wherein the activator does not include a compound represented by the General Formula (sa); and a solvent, wherein the solvent does not include a compound represented by the General Formula (sa), wherein the rosin (P) includes a rosin (PA) having a softening point of higher than 100° C. and a rosin (PB) having a softening point of 100° C. or lower;

a mixing ratio of the rosin (PA) and the rosin (PB) in terms of a mass ratio represented by (PA)/(PB) is (PA)/(PB)=5/5 to 9/1;

a content of the compound (SA) is 0.1% by mass or more and 6% by mass or less with respect to the total mass (100% by mass) of the flux, and a content of the solvent is 60% by mass or more and 95% by mass or less with respect to the total mass (100% by mass) of the flux,

(sa)

in General Formula (sa), $R^{11}$ represents a hydrocarbon group which may have a hydroxy group, $R^{12}$ and $R^{13}$ each independently represent a hydrocarbon group having 5 or less carbon atoms, which may have a substituent, a hydroxy group, or a hydrogen atom, and m represents a positive integer.

2. The flux according to claim 1, wherein the rosin (PA) includes at least one rosin (P1) selected from the group consisting of an acrylic acid-modified hydrogenated rosin and a polymerized rosin, and the rosin (PB) includes a hydrogenated rosin.

3. The flux according to claim 1, wherein a content of the compound (SA) is 1 to 60 parts by mass with respect to 100 parts by mass of the rosin (P).

4. The flux according to claim 1,
wherein the activator includes a compound represented by General Formula (a1),

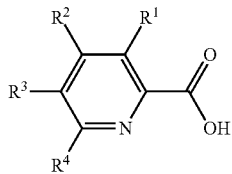

in General Formula (a1), $R^1$, $R^2$, $R^3$, and $R^4$ each independently represent a hydrocarbon group, a hydroxy group, a halogen atom, or a hydrogen atom.

5. The flux according to claim 1, wherein the activator includes an alkanolamine.

6. The flux according to claim 1,
wherein the solvent includes at least one selected from the group consisting of ethanol and 2-propanol.

7. The flux according to claim 1, wherein a concentration of solid contents of the flux is 20% by mass or less.

8. The flux according to claim 1, wherein a content of the solvent is 70% by mass or more and 95% by mass or less with respect to 100% by mass of the flux.

9. The flux according to claim 1, wherein a content of the rosin (PA) is 2% by mass or more and 30% by mass or less with respect to 100% by mass of the flux, and
a content of the rosin (PB) is more than 1% by mass and 15% by mass or less with respect to 100% by mass of the flux.

10. The flux according to claim 1, wherein the softening point of the rosin (PB) is 96° C. or lower.

11. The flux according to claim 10, wherein the softening point of the rosin (PA) is higher than 110° C. and 170° C. or lower, and the softening point of the rosin (PB) is 60° C. or higher and 96° C. or lower.

12. The flux according to claim 1, wherein the compound (SA) is at least one selected from the group consisting of polyethylene glycol, polypropylene glycol, polyglycerin, a polyethylene glycol-polypropylene glycol copolymer, and an ethylene oxide-resorcin copolymer.

13. The flux according to claim 1, wherein the solvent includes an alcohol-based solvent having a boiling point of 100° C. or lower.

14. A method for producing an assembly, comprising:
applying the flux according to claim 1 on a substrate; and
soldering a solder alloy to a surface of the substrate to obtain the assembly.

15. The method for producing an assembly according to claim 14,
wherein the solder alloy contains Sn and Bi.

* * * * *